(12) United States Patent
Alvarez et al.

(10) Patent No.: US 7,369,010 B2
(45) Date of Patent: May 6, 2008

(54) LASER TRIMMING TO TUNE THE RESONANCE FREQUENCY OF A SPIRAL RESONATOR, THE CHARACTERISTICS OF A HIGH TEMPERATURE SUPERCONDUCTOR FILTER COMPRISED OF SPIRAL RESONATORS, OR THE RESONANCE OF A PLANAR COIL

(75) Inventors: Robby L. Alvarez, Newark, DE (US); Calixto Estrada, Middletown, DE (US); Juinn-Sheng Guo, Newark, DE (US); Robert J. Rossi, Wilmington, DE (US); Zhi-Yuan Shen, Wilmington, DE (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 10/992,448

(22) Filed: Nov. 18, 2004

(65) Prior Publication Data
US 2005/0256009 A1   Nov. 17, 2005

Related U.S. Application Data

(60) Provisional application No. 60/523,988, filed on Nov. 21, 2003.

(51) Int. Cl.
*H01P 1/203*   (2006.01)
*H01P 3/08*    (2006.01)

(52) U.S. Cl. ............... 333/99 S; 333/204; 505/700

(58) Field of Classification Search .......... 333/99 S, 333/204; 505/700, 705
See application file for complete search history.

(56) References Cited

U.S. PATENT DOCUMENTS

| 3,947,934 A | * | 4/1976 | Olson .................. 29/25.42 |
| 4,888,568 A | * | 12/1989 | Kawaguchi ............... 333/174 |
| 5,135,908 A | | 8/1992 | Yang |
| 5,616,539 A | * | 4/1997 | Hey-Shipton et al. .... 333/99 S |
| 5,952,269 A | | 9/1999 | Ma |
| 2001/0011936 A1 | | 8/2001 | Schallner et al. |
| 2003/0048148 A1 | | 3/2003 | Humphreys et al. |

FOREIGN PATENT DOCUMENTS

EP   1 271686 A1   6/2001
WO   WO 01/41251 A1   6/2001

OTHER PUBLICATIONS

N.J. Parker et. al., Tuning Superconducting Microwave Filters by Laser Trimming, 2000, IEEE MT-S, pp. 1971-1974.
M.T. De Melo et. al., Comparison Between the Quality Factors of Microstrip Resonators Using Films Made by Deeping Pyrolisis and Laser Ablation Processes, Physica, 2000, pp. 2671-2672.
International Search Report Dated May 27, 2005, International Application No. PCT/US2004/039332, International Filing Date: Nov. 19, 2004.

* cited by examiner

*Primary Examiner*—Robert Pascal
*Assistant Examiner*—Kimberly E Glenn

(57) ABSTRACT

This invention provides a laser trimming method for tuning the frequency of a spiral resonator, and for improving the characteristics of a high temperature superconductor filter comprised of high temperature superconductor spiral resonators, by tuning the individual high temperature superconductor spiral resonators. This invention also provides a method for tuning the resonance frequency of a high temperature superconductor planar coil. This invention also provides a laser ablation process for creating high temperature superconductor circuit elements.

24 Claims, 21 Drawing Sheets

LASER TRIMMING TO TUNE THE RESONANCE FREQUENCY OF A SPIRAL RESONATOR, THE CHARACTERISTICS OF A HIGH TEMPERATURE SUPERCONDUCTOR FILTER COMPRISED OF SPIRAL RESONATORS, OR THE RESONANCE OF A PLANAR COIL

This application claims the benefit of U.S. Provisional Application No. 60/523,988, filed on Nov. 21, 2003, which is incorporated in its entirety as a part hereof for all purposes.

FIELD OF THE INVENTION

This invention relates to laser trimming to tune the resonance frequency of a spiral resonator, to tune individual spiral resonators of a high temperature superconductor filter to improve the filter characteristics, or to tune the resonance frequency of a planar coil.

BACKGROUND OF THE INVENTION

High temperature superconductor (HTS) filters have applications in telecommunication, instrumentation and military equipment. The HTS filters have the advantages of extremely low in-band insertion loss, high out-of-band rejection and steep skirts due to the extremely low loss in the HTS materials. In a typical design, HTS filters and mini-multiplexers are comprised of spiral resonators.

Filter performance is highly dependent on the frequencies of the resonators of which the filter was comprised. In turn, variations in circuit parameters such as resonator patterning, substrate thickness and dielectric constant, and HTS material properties affect the frequency of the resonators. It is both difficult and costly to try to control these parameters precisely during production. The difficulty in producing the desired HTS filter pattern increases as the number of resonators or poles in the filter increases.

It is therefore desirable to tune the filters after they have been produced. One approach to tuning the center frequency of such a filter proposed by Shen, WO 01/41251, involves providing a plate spaced a distance apart from and opposite to the HTS filter. The plate contains a conductive film, preferably a HTS film, on at least a portion of the surface of the plate that faces the filter. The distance between the plate and the filter can be adjusted to tune the center frequency of the filter. Alternatively, the individual resonators of the filter can be mechanically tuned by adjusting a screw or a dielectric rod. However, since the resonators generally vary in a random fashion, each pole of the filter must be individually tuned and the tuning of each pole affects every other pole in the filter. The tuning process can typically take hours to perform.

Humphreys, U.S. Ser. No. 03/048,148, and N. J. Parker et al, 2000 IEEE MTT-S, page 1971, disclose tuning a microwave or RF circuit by directing a laser beam onto the microwave or RF circuit so as to alter the material properties of selected areas of the microwave or RF circuit. Results are disclosed for a simple microstrip $\lambda/2$ resonator and a pseudo-elliptic filter comprised of 3 simple microstrip $\lambda/2$ resonators. They disclose that it is easier to increase the resonator frequencies than to reduce them.

An object of the present invention is to tune the resonance frequency of a HTS spiral resonator or a HTS coil and to improve the production yield of HTS filters comprised of HTS spiral resonators by providing a method for tuning the characteristics of such a filter by tuning individual HTS spiral resonators.

SUMMARY OF THE INVENTION

This invention provides a method for tuning the resonance frequency of a high temperature superconductor spiral resonator by ablating portions of the high temperature superconductor spiral resonator with a laser beam.

The resonance frequency of a high temperature superconductor spiral resonator can be increased by ablating the high temperature superconductor at the outer end of the high temperature superconductor spiral of the spiral resonator. The resonance frequency of a high temperature superconductor spiral resonator can be decreased by ablating the high temperature superconductor at the inner end of the high temperature superconductor spiral of the spiral resonator. Laser trimming at interior locations along the high temperature superconductor spiral resonator results in increases or decreases in the resonance frequency depending upon the location of the trimming. Increases in the resonance frequency result when trimming at interior locations at which the current density is sufficiently low, and decreases in the resonance frequency result when trimming at interior locations where the current density is sufficiently high. The resulting resonance frequency shifts from multiple trimmings are additive.

This invention also provides a method for tuning the filter characteristics of a high temperature superconductor filter comprised of at least two high temperature superconductor spiral resonators by ablating portions of one or more of the high temperature superconductor spiral resonators with a laser beam.

This invention also provides a method for tuning the resonance frequency of a high temperature superconductor planar coil by ablating portions of the high temperature superconductor planar coil with a laser beam.

The resonance frequency of a high temperature superconductor planar coil can be increased by ablating the high temperature superconductor at the outer end of the high temperature superconductor of the planar coil or at the inner end of the high temperature superconductor of the planar coil. Laser trimming at interior locations along the high temperature superconductor planar coil results in increases or decreases in the resonance frequency depending upon the location of the trimming. Increases in the resonance frequency result when trimming at interior locations at which the current density is sufficiently low, and decreases in the resonance frequency result when trimming at interior locations where the current density is sufficiently high. The resulting resonance frequency shifts from multiple trimmings are additive.

This invention also provides a process for forming a high temperature superconductor circuit element, comprising:

a) forming a film of a high temperature superconductor material on a substrate; and b) ablating selected regions of the high temperature superconductor film with a laser beam while protecting from ablation other regions of the high temperature superconductor film that form a pattern of the circuit element.

The circuit element can be a spiral resonator, a filter, a coil or any other useful high temperature superconductor component.

DETAILED DESCRIPTION OF THE PREFERRED EMBODIMENTS

The present invention provides a method for tuning the resonance frequency of a high temperature superconductor spiral resonator by laser trimming the high temperature superconductor spiral resonator. This method provides for readily increasing or decreasing the resonance frequency of the high temperature superconductor spiral resonator. The present invention also provides a method for tuning the characteristics, such as the filter characteristics, of a high temperature superconductor filter comprised of at least two high temperature superconductor spiral resonators by laser trimming one or more of the high temperature superconductor spiral resonators. This method makes it possible to increase or decrease the center frequency of the HTS filter as well as to hold the center frequency essentially constant while adjusting the response within the band-pass region, or to both change the center frequency of the HTS filter and adjusting the response within the band-pass region. When the HTS filter is further comprised of HTS inter-resonator couplers, laser trimming the HTS inter-resonator couplers decreases the bandwidth of the band-pass region. Laser trimming, or trimming, is the use of a laser beam to ablate high temperature superconductor material.

Typically, an HTS spiral resonator, or filter comprised of spiral resonators, is prepared by depositing a film of HTS material on an appropriate single crystal substrate and then coating the HTS material with photoresist. A mask with the spiral resonator or filter pattern is then placed on the photoresist and exposed to actinic light. The photoresist is developed, and the portion of the HTS material exposed when the resist is developed is removed, e.g. by argon ion etching. The remaining resist is then removed, e.g. by oxygen etching. Other preparations of the HTS spiral resonator or filter can also be used. No matter how the HTS spiral resonator or filter is prepared, the laser trimming method of this invention can subsequently tune the HTS spiral resonator or filter.

A novel one-step process for creating the HTS filter from the HTS film is to laser etch the HTS film to form and tune the filter. This technique can also be used to create HTS resonators, HTS coils and other HTS circuit elements. Preferably, the HTS coils are planar coils, i.e. surface coils. A laser can be programmed to direct the laser beam to impact those regions of the HTS film that are to be ablated by the laser beam and to avoid those regions of the HTS film that form the desired pattern of the HTS element.

Figure 1:
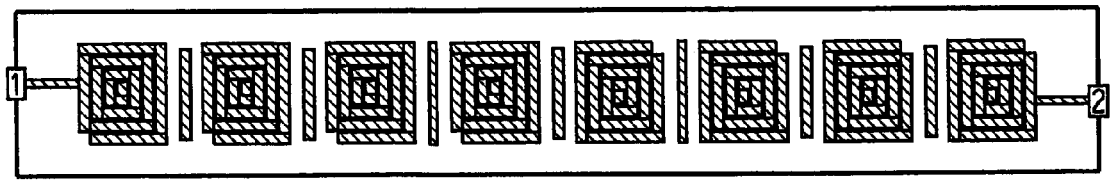
FIG. 1 shows an 8-pole filter comprised of eight HTS rectangular spiral resonators and seven HTS inter-resonator couplers.
Figure 2:
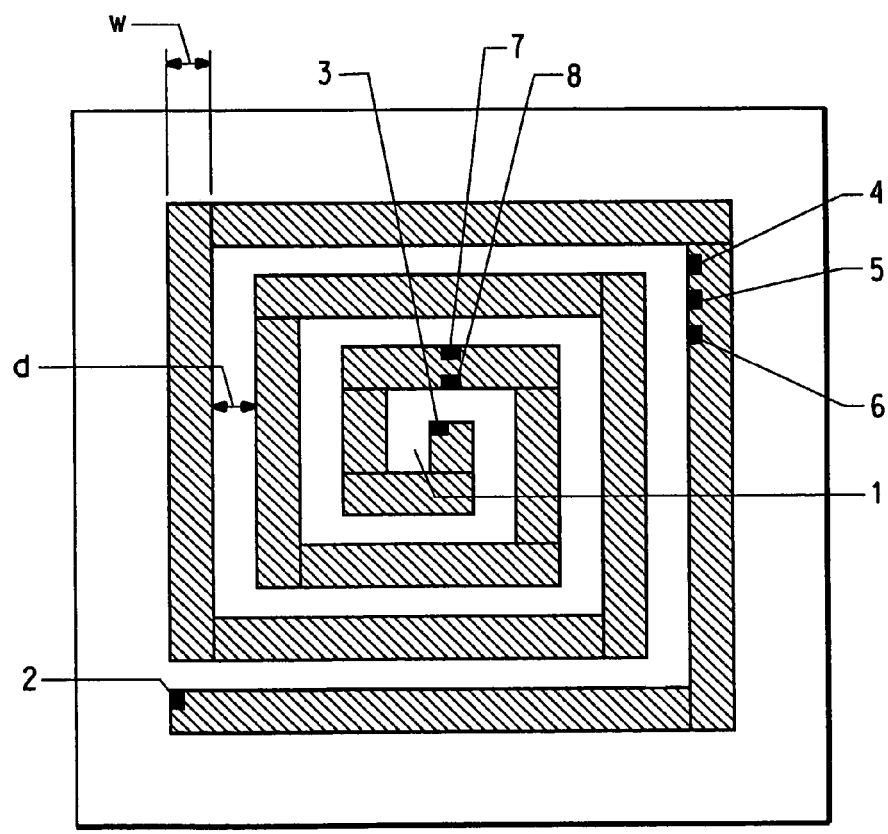
FIG. 2 shows a rectangular spiral resonator with some trimming locations identified.

An 8-pole or 8-resonator HTS filter comprised of 8 rectangular HTS spiral resonators and 7 HTS inter-resonator couplers is shown in FIG. 1. An HTS filter of this design was used in Example 1 and is further described there. FIG. 2 shows one of the HTS spiral resonators. This spiral resonator comprises a high temperature superconductor line of width w oriented in a rectangular spiral fashion such that adjacent lines of the spiral resonator are spaced from each other by a gap distance d and so as to provide a central opening 1 within the spiral resonator.

The resonance frequency is $$f_s = 1/\{2\pi[LC]^{1/2}\}$$

wherein L and C are the inductance and capacitance of the spiral resonator. Equivalently, resonance occurs when the length of the spiral resonator equals $n\lambda/2$, where $\lambda$ is the wavelength of the propagating electromagnetic wave and n is an integer. The HTS spiral resonators can have different shapes, including rectangular, rectangular with rounded corners, polygonal with more than four sides and circular. Preferably, all the HTS spiral resonators in a filter have the same shape. A conductive tuning pad may be placed in the central opening 1 to fine-tune the frequency of the spiral resonator. This tuning pad can be a high temperature superconductor and can be ablated during the laser trimming process to adjust the resonance frequency.

It has now been found that the resonance frequency of a HTS spiral resonator can be readily increased or decreased by trimming the HTS spiral line at particular locations. For example, trimming, i.e. ablating, high temperature superconductor material at the outer end of the HTS spiral, e.g. at location 2 shown in FIG. 2, increases the resonance frequency. In contrast, trimming high temperature superconductor material at the inner end of the HTS spiral, e.g. at location 3 in FIG. 2, decreases the resonance frequency.

The resonance frequency can also be readily increased or decreased by trimming at interior locations along the HTS spiral. Interior locations are any locations along the HTS spiral between the outer end 2 and the inner end 3, e.g. at locations 4 to 8 on FIG. 2. Whether there is an increase or decrease in the resonance frequency when trimming at interior locations, and (if so) the magnitude of the frequency change, depends on the location along the HTS spiral where trimming occurs; and, for a given distance along the HTS spiral, also depends on whether the location is on the outer edge of the HTS spiral line (e.g. location 7) or on the inner edge of the HTS spiral line (e.g. locations 3, 4, 5 and 8).

This dependence of the change in resonance frequency on trimming location is a result of the fact that different locations have different current densities. There is a variation in current density at different locations along the HTS spiral line, and between the outer edge and inner edge of the HTS line. For a given amount of material trimmed, there is a linear relation between the current density at the trimming location and the change in frequency. Trimming at interior locations at which the current density is low results in resonance frequency increases. At trimming locations with somewhat larger current densities, the magnitude of the increase in resonance frequency becomes smaller for the same amount of trimming. At trimming locations where the current density is high, trimming results in a decrease in the resonance frequency. The larger the current density at a location, the larger the decrease in the resonance frequency obtained from a particular amount of trimming.

A location, such as an interior location, at which the current density is sufficiently low such that the resonance frequency is increased when the HTS spiral line is trimmed at that location will generally have a current density that is less than about 25% of the maximum current density observed along the HTS spiral line. A location, such as an interior location, at which the current density is sufficiently high such that the resonance frequency is decreased when the HTS spiral line is trimmed at that location will generally have a current density that is greater than about 25% of the maximum current density observed along the HTS spiral line. The amount of current density that will produce an increase or decrease in resonance frequency is not, however, invariably limited to those ranges.

For example, trimming locations 4 to 6 are far enough along the HTS spiral line from the outer end, and are on the inner edge of the HTS spiral line, such that the current densities are sufficiently high at those locations to result in resonance frequency decreases when trimmed. As indicated above, for a given amount of trimming the decrease in the resonance frequency is most effective in regions of highest current density. Larger decreases in resonance frequency occur for laser trimming at location 4, which is closer to a spiral resonator corner where a higher current density is expected and observed, compared to that found for the same amount of laser trimming at location 5, which is farther from the corner and has a smaller current density. Location 6, which is farthest from the corner, has the lowest current density of these three locations, and therefore shows the smallest shift in resonance frequency when trimmed.

The magnitude of the increase or decrease in the resonance frequency depends on the amount of HTS ablated. Choice of various different interior locations provides a different sensitivity, i.e. a different magnitude of increase or decrease in frequency, for the same amount of ablation, depending on the current density at the location.

The characteristics of an HTS filter comprised of at least two HTS spiral resonators can be changed in various ways by laser trimming. If the center frequency of the band-pass is the desired frequency, the in-band characteristics can be improved by laser trimming one or more of the individual HTS spiral resonators so that all of the HTS spiral resonators have a resonance frequency equal to the band-pass center frequency. If the center frequency of the band-pass is not the desired frequency, a lower or higher center frequency can be obtained by laser trimming the individual HTS spiral resonators so that all of the HTS spiral resonators have a resonance frequency equal to the lower or higher center frequency. In addition, the in-band characteristics will be improved.

The inter-resonator couplings between adjacent HTS spiral resonators in the HTS filter are provided by the overlapping of the electromagnetic fields at the edges of the adjacent spiral resonators. In addition, as shown in FIG. 1, HTS lines can be provided between the HTS spiral resonators to serve as inter-resonator couplers. When HTS inter-resonator couplers are provided, these couplers can be laser trimmed to decrease the bandwidth of the band-pass region.

The method for tuning the resonance frequency of a high temperature superconductor planar coil is analogous to that used for tuning the resonance frequency of a spiral resonator with one exception. Trimming high temperature superconductor material at the outer end of the HTS planar coil increases the resonance frequency. The resonance frequency can be readily increased or decreased by trimming at interior locations along the HTS planar coil. Increases in the resonance frequency result when trimming at interior locations at which the current density is sufficiently low, and decreases in the resonance frequency result when trimming at interior locations where the current density is sufficiently high.

The one exception to analogous behavior of the HTS planar coil trimming and HTS spiral resonator trimming involves the trimming of high temperature superconductor material at the inner end of the HTS planar coil. Since the coupling at the inner end of a planar coil is not nearly as strong as the coupling at the inner end of a spiral resonator, trimming high temperature superconductor material at the inner end of the HTS planar coil results in an increase in resonance frequency instead of the decrease in resonance frequency found when trimming at the inner end of a spiral resonator. The resulting resonance frequency shifts from multiple trimmings are additive.

In all of the embodiments described above, it is preferred that the high temperature superconductor is selected from the group consisting of $YBa_2Cu_3O_7$, $Tl_2Ba_2CaCu_2O_8$, $TlBa_2Ca_2Cu_3O_9$, $(TlPb)Sr_2CaCu_2O_7$ and $(TlPb)Sr_2Ca_2Cu_3O_9$. A single crystal substrate is independently selected from the group consisting of $LaAlO_3$, MgO, $LiNbO_3$, sapphire ($Al_2O_3$) and quartz. $LaAlO_3$ and sapphire are preferred. The presence of a buffer or intermediate layer of an oxide on the substrate before the deposition of the superconductor can be useful in promoting growth of the superconductor film. Reference herein to "depositing a film of HTS material on an appropriate single crystal substrate"

will thus include direct intimate contact with the substrate as well as intimate contact with an intermediate or buffer layer on the substrate.

The laser trimming method for tuning HTS resonators, HTS filters and HTS coils and for forming HTS circuit elements can be carried out with various lasers, but an excimer laser is preferred. It is important to be able to carry out the laser trimming while the HTS circuit element is at liquid nitrogen temperature so that the HTS material is superconductive and changes in the HTS circuit element performance can be monitored during the trimming process. Provisions must be made for electrical connections between the HTS circuit element and a circuit analyzer.

The advantageous effects of this invention are demonstrated by a series of examples, as described below. The embodiments of the invention on which the examples are based are illustrative only, and do not limit the scope of the appended claims.

In Examples 1, 28, 29 and 30 that follow, the following apparatus and procedure are used. A 193 nm excimer laser (Lambda Physik LPX.□220, Gottingen, Germany) equipped with 0.1 µm precision X, Y, Z, theta stage and with in process and targeting cameras is used for the trimming. A rectangular variable aperture or image projection mask is used to configure the laser demagnification to a 50 µm×50 µm square spot. The laser voltages and variable transmission ranges are configured to yield between 500 and 1200 mJ/cm$^2$. Preferred is a 12× demagnification to provide the 50 µm×50 µm focussed square spot with a yield of between 750 and 1000 mJ/cm$^2$. The substrate with the filter is mounted onto a copper filter mount. A liquid nitrogen fixture provides a reservoir for liquid nitrogen and enables electrical connections between the filter and the analyzer, an Agilent 8753 Vector Network Analyzer (Agilent Technologies, Palo Alto, Calif.). This allows the filter to be laser trimmed at liquid nitrogen temperatures while simultaneously powering and monitoring filter response to the trimming.

The network analyzer provides the plots of $S_{11}$ and $S_{21}$. $S_{11}$ is the magnitude of the reflection coefficient from the input port. $S_{21}$ is the magnitude of the transmitting coefficient from the input port to the output port. $S_{11}$ and $S_{21}$ are important parameters for practical applications of a filter and are used here to characterize the changes in the filter as a result of the laser trimming. Outside the band-pass region, $S_{11}$ should be nearly 1, i.e. about 0 dB. The magnitude of $S_{11}$ in the band-pass region should be as low as possible. $S_{21}$ should be nearly 1, i.e. about 0 dB in the band-pass region. The magnitude of $S_{21}$ outside the band-pass region should be as low as possible.

The copper filter mount with the mounted substrate is secured onto the liquid nitrogen fixture. The liquid nitrogen fixture is mounted onto the X, Y, Z, theta stage of the laser. The filter surface must be planar with the focal point of the laser. Laser test bursts are taken onto a non-critical area of the filter surface to ensure that the laser is in focus and both cameras are aligned. An aluminum cover is placed over the filter and secured onto the copper filter mount. The aluminum cover has an opening that extends over the entire surface of the aluminum cover. The aluminum cover provides a support for a quartz window that is secured to the aluminum cover with tape. The quartz window contains liquid nitrogen boil-off over the filter, and prevents condensation and/or frost from forming on the filter surface while allowing the 193 nm UV radiation to transmit through for trimming. A temporary liquid nitrogen fixture cover is placed over the liquid nitrogen fixture, aluminum cover and quartz window to prevent condensation accumulation on the quartz window surface.

Dry nitrogen gas is used to purge the laser beam delivery optics, the beam delivery nozzle and the liquid nitrogen fixture. This purge is continued for 15-20 minutes. RF cables are then connected to the input and output of the filter and to the network analyzer. Liquid nitrogen is slowly added to the liquid nitrogen fixture reservoir until it is full. Liquid nitrogen continues to be added to replace the amount that boils off until the liquid nitrogen fixture temperature is stabilized. Stabilization can be confirmed by observing the filter response as displayed by the analyzer. The temporary liquid nitrogen fixture cover is removed and laser focus and beam alignment are confirmed by taking additional test bursts through the quartz window and onto a non-critical area of the filter surface. The spiral resonators of the filter are now ready for trimming.

EXAMPLE 1

This example demonstrates the use of the laser trimming method of the invention to improve the characteristics of the band-pass region of an 8-pole filter with the design shown in FIG. 1, while holding the center frequency and the bandwidth of the band-pass region of the filter essentially constant.

The 8-pole HTS filter is produced using double-sided $Tl_2Ba_2CaCu_2O_8$ films on a $LaAlO_3$ substrate and prepared as follows. A clean, polished single crystal $LaAlO_3$ substrate, 75 mm×35 mm×0.5 mm, was obtained from MTI Corporation, Richmond, Calif. Off-axis magnetron sputtering of a Ba:Ca:Cu oxide target with a stoichiometry of 2:1:2 is used to deposit, at room temperature (about 20° C.), an amorphous precursor Ba:Ca:Cu oxide film onto both sides of the substrate. This amorphous Ba:Ca:Cu oxide film is about 550 nm thick and had a stoichiometry of about 2:1:2. The precursor film is then thallinated by annealing it in air for about 10 minutes at 850° C. in the presence of a powder mixture of $Tl_2Ba_2Ca_2Cu_3O_{10}$ and $Tl_2O_3$. When this powder mixture is heated, $Tl_2O$ evolves from the powder mixture, diffuses to the precursor film and reacts with it to form the $Tl_2Ba_2CaCu_2O_8$ phase.

The $Tl_2Ba_2CaCu_2O_8$ film surface is then cleaned using an argon ion beam. A gold film is evaporated onto and completely covered the unpatterned $Tl_2Ba_2CaCu_2O_8$ film on the back side of the substrate. The sample is then coated with photoresist on both sides and baked. The filter design mask with three filters of the design shown in FIG. 1 is prepared. The HTS lines of each resonator are 300 µm with a gap of 50 µm between the HTS lines. The drawing in FIG. 1 is to scale. The filter design mask is then placed on the photoresist covering the $Tl_2Ba_2CaCu_2O_8$ film on the front side of the substrate and exposed to ultraviolet light. The resist is then developed and the portion of the $Tl_2Ba_2CaCu_2O_8$ film exposed when the resist is developed is etched away by argon beam etching. The remaining photoresist layer is then removed by oxygen plasma. A dicing saw is then used to section the individual filters. One of these filters is used in this example.

The filter is then mounted and preparations for trimming are made as described above.

Figure 3:
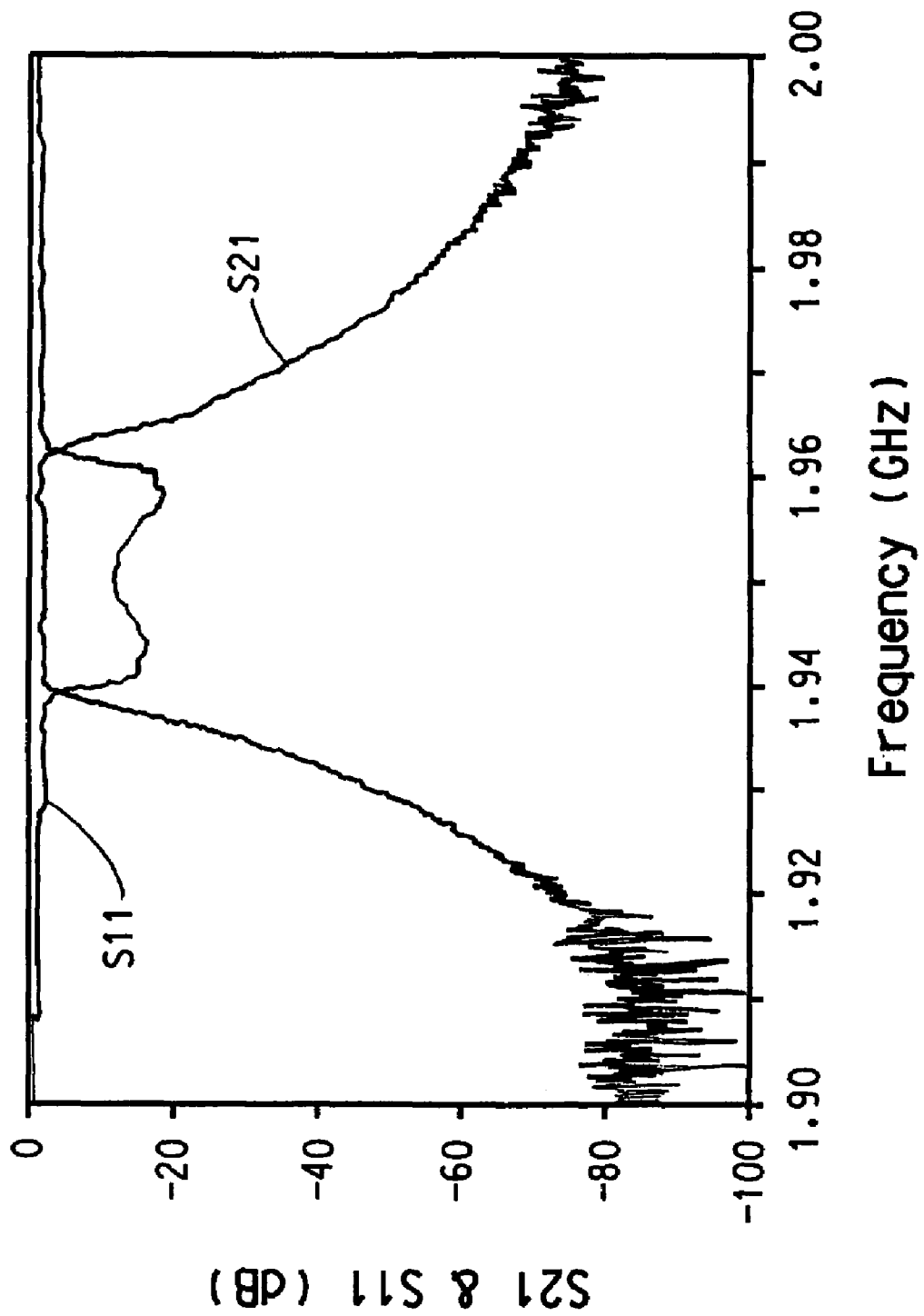
FIG. 3 shows the $S_{21}$ and the $S_{11}$ of the 8-pole filter of Example 1 before the laser trimming of the invention.

$S_{11}$ and $S_{21}$ are measured for the filter before laser trimming and the results are shown in FIG. 3.

The spiral resonators of the filter underwent the following laser trimming while monitoring $S_{11}$ and $S_{21}$ as provided by the analyzer. The goal is to improve the characteristics of the band-pass region while holding the center frequency and the bandwidth of the band-pass region of the filter essentially constant. The process used is an iterative one and essentially the same for each of the spiral resonators in turn. Trimming is begun at the outer end of the spiral of the first spiral resonator. This raised the resonance frequency of the spiral resonator. Trimming at the outer end is continued as long as filter performance as measured by $S_{11}$ and $S_{21}$ continues to improve. If initial or continued trimming at the outer end of the spiral makes performance worse for this or any of the other spiral resonators, trimming there is stopped and trimming is begun at an inner corner of the spiral where the current density is sufficiently high so that trimming would result in a decrease of the resonance frequency. Trimming is continued at this inner corner as long as performance improves. This process is repeated with each of the resonators in turn until all 8 spiral resonators had been trimmed. The process of trimming all 8 spiral resonators is repeated 4 more times. The number of iterations is dependent upon the filter performance achieved in comparison to the filter performance desired.

Figure 4:
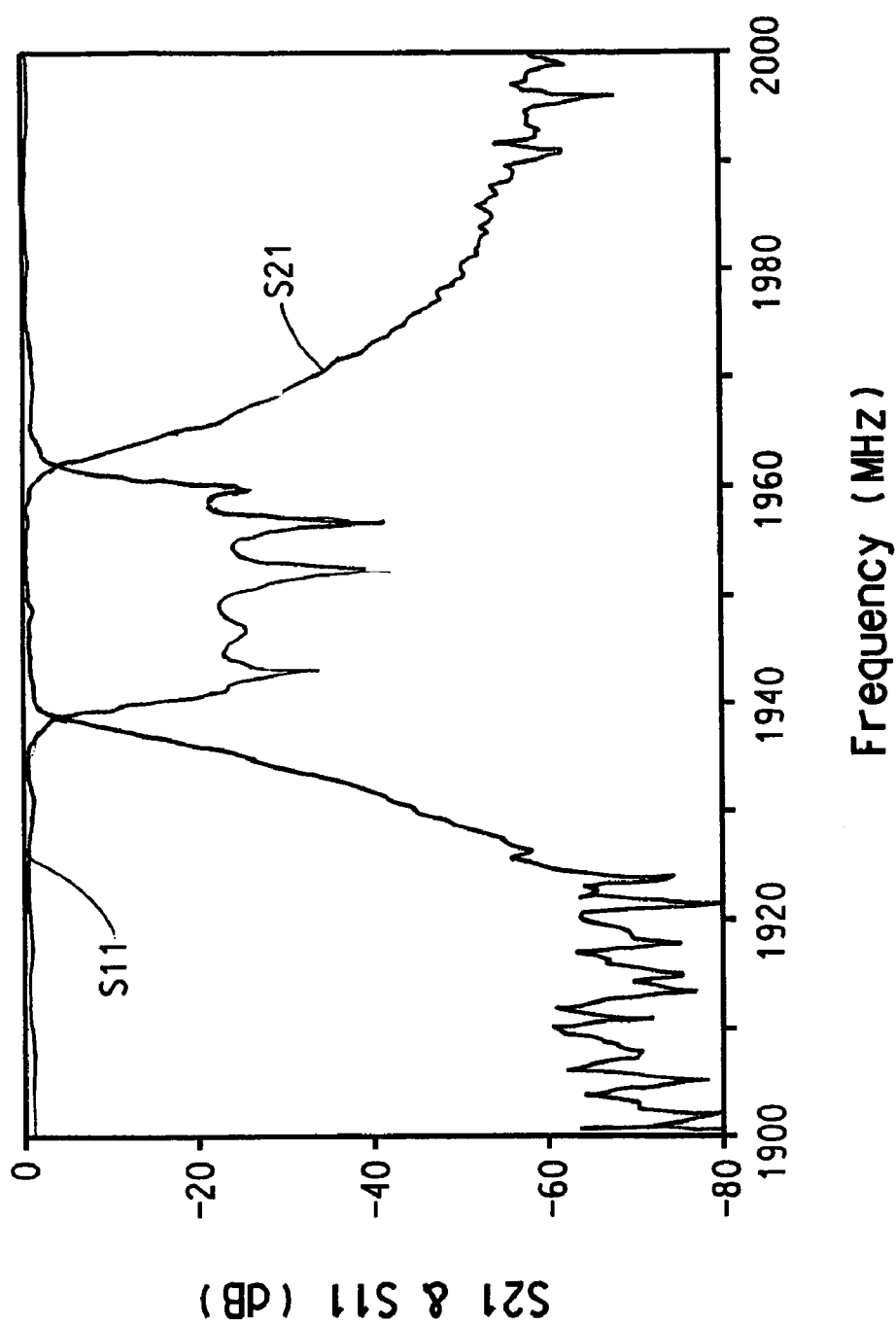
FIG. 4 shows the $S_{21}$ and the $S_{11}$ of the 8-pole filter of Example 1 after the laser trimming of the invention.

$S_{11}$ and $S_{21}$ are measured for the filter after laser trimming and the results are shown in FIG. 4. Comparison with the results shown in FIG. 3 for these coefficients before trimming show that the center frequency and the bandwidth of the band-pass region remain essentially unchanged. However the magnitude of $S_{11}$ in the band-pass region has been lowered, resulting in improved filter performance.

EXAMPLES 2-4

These examples are carried out using Sonnet EM software, obtained from Sonnet Software, Inc., Liverpool, N.Y. 13088, to simulate the performance of a HTS spiral resonator and demonstrate the changes in the resonance frequency of the HTS spiral resonator for various amounts of ablation at the outer end of the spiral. The following model is used. The substrate had a thickness of 0.508 mm and a dielectric constant of 24 and had a front side and a back side. The spiral resonator is in intimate contact with the front side of the substrate. A ground plane, which in practice would be a blank, i.e. continuous, HTS film, is on the back side of the substrate. The grounded top cover and side walls of the circuit are all sufficiently far from the spiral resonator so as to have negligible effect.

Figure 5:
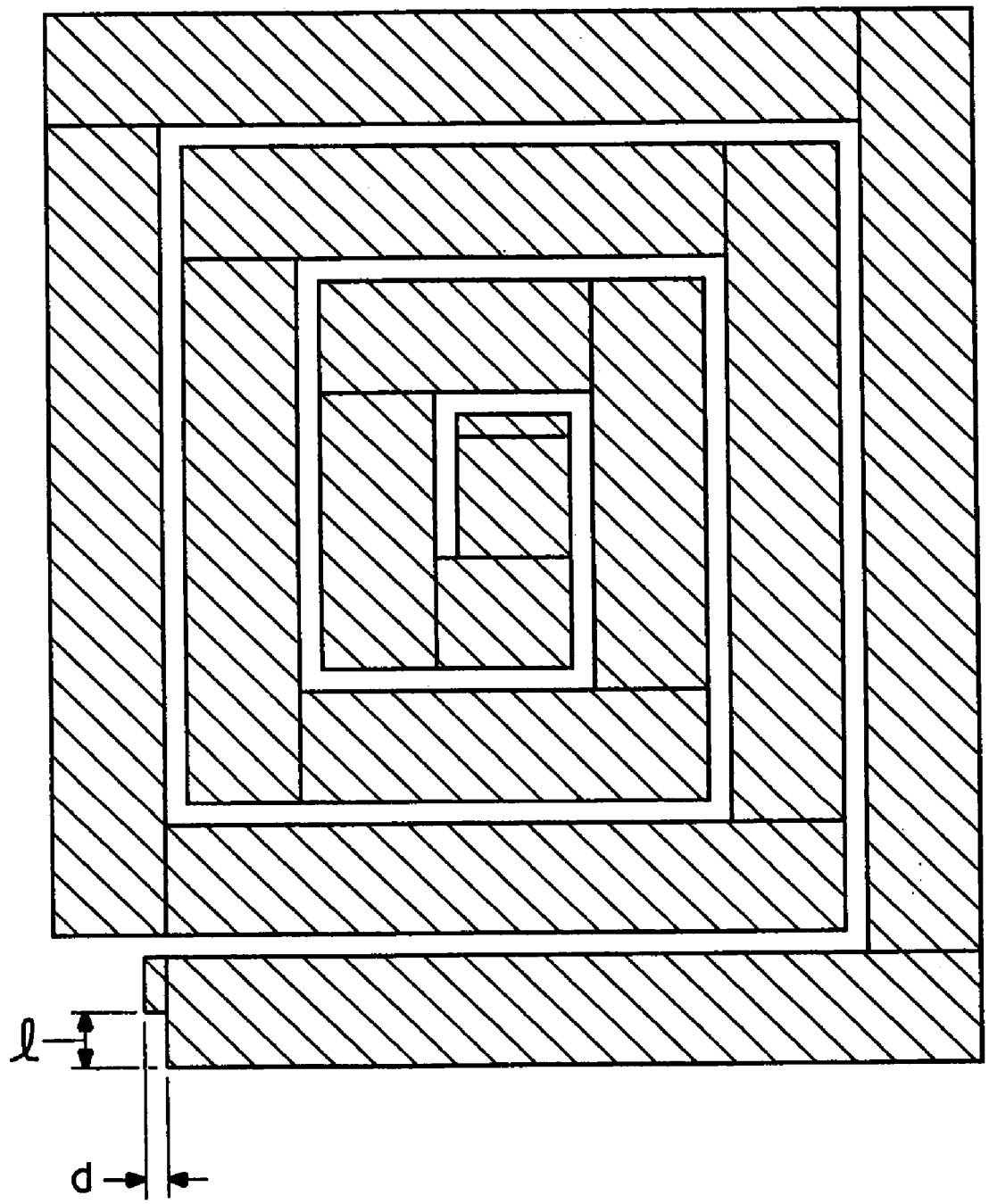
FIG. 5 shows the rectangular spiral resonator used in Examples 2-4 and the locations of the material removed.
Figure 6:
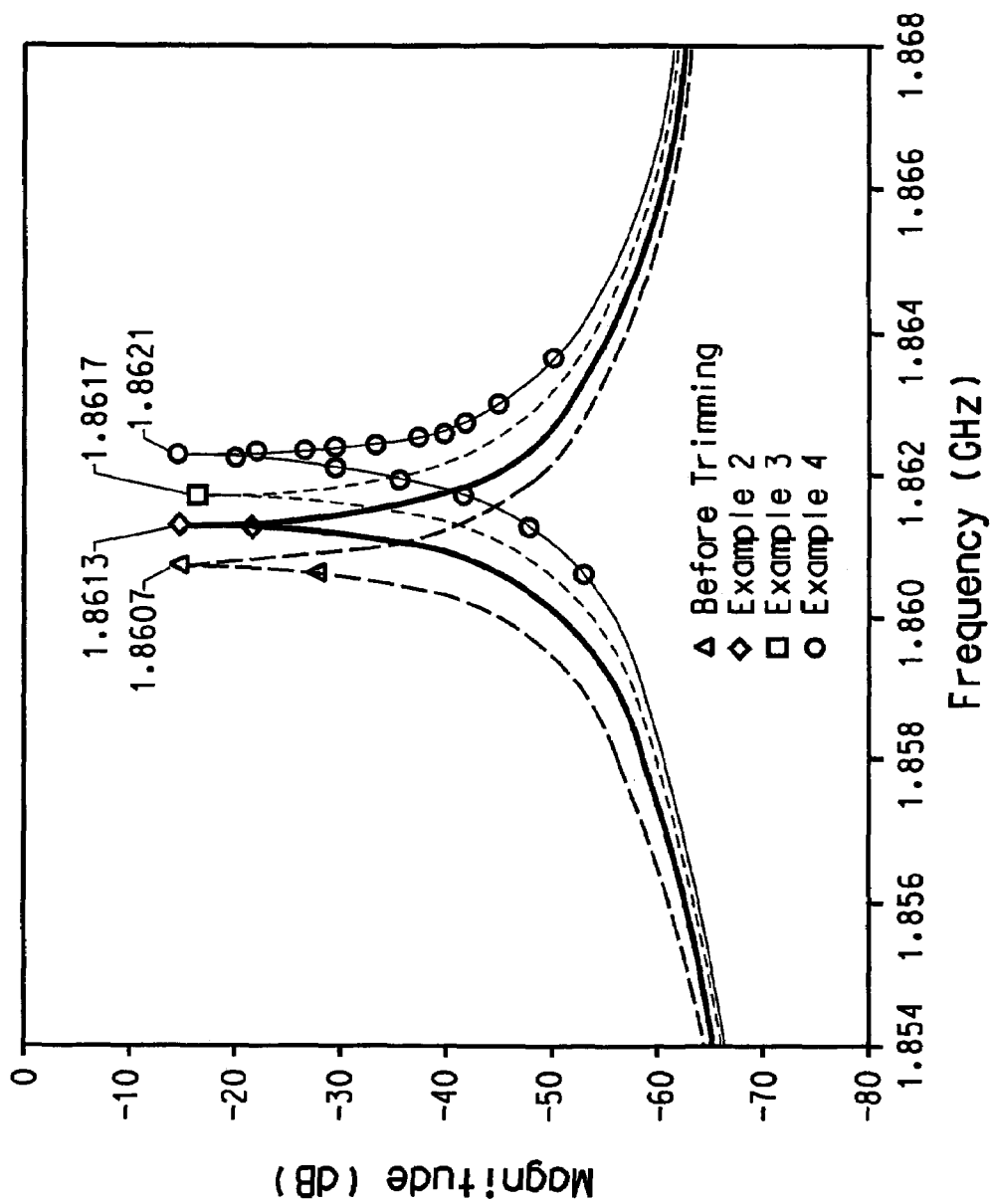
FIG. 6 shows the resonance curves and frequencies for Examples 2-4.

The rectangular spiral resonator shown in FIG. 5 is chosen for the simulation. The line widths of the spiral resonator are 308 μm with a gap of 44 μm between lines. The resonance frequency of the spiral resonator with no material removed is 1.8607 GHz. As shown in FIG. 5, material is removed at the outer end of the resonator to simulate the removal of HTS material there by laser ablation. The amount of material removed is a cut of depth d and length 1 as shown in FIG. 5. In each example, the depth of the material removed is the same, i.e. d=44 Am. The lengths 1 of the cuts are 44 μm for Example 2, 88 μm for Example 3 and 132 μm for Example 4. The resonance frequency is next determined for the spiral resonator of each of the examples. The resonance frequencies are 1.8613 GHz for Example 2, 1.8617 GHz for Example 3 and 1.8621 GHz for Example 4. The resonance curves and frequencies are shown in FIG. 6. The increases in resonance frequency from the untrimmed resonance frequency are summarized in Table I.

TABLE I

| Example | Trimming Size (μm) | Increase in Resonance Frequency (MHz) |
|---|---|---|
| 2 | 44 × 44 | 0.6 |
| 3 | 44 × 88 | 1.0 |
| 4 | 44 × 132 | 1.4 |

These examples demonstrate the increase in the resonance frequency of a spiral resonator when material is ablated from the outer end of the spiral. The resonance frequency increased more as more material is removed.

EXAMPLES 5-7

These examples are carried out using the same Sonnet EM software and the same rectangular spiral resonator and substrate used in Examples 2-4. As for the resonator of Examples 2-4, the resonance frequency of the spiral resonator with no material removed is 1.8607 GHz.

Figure 7A:
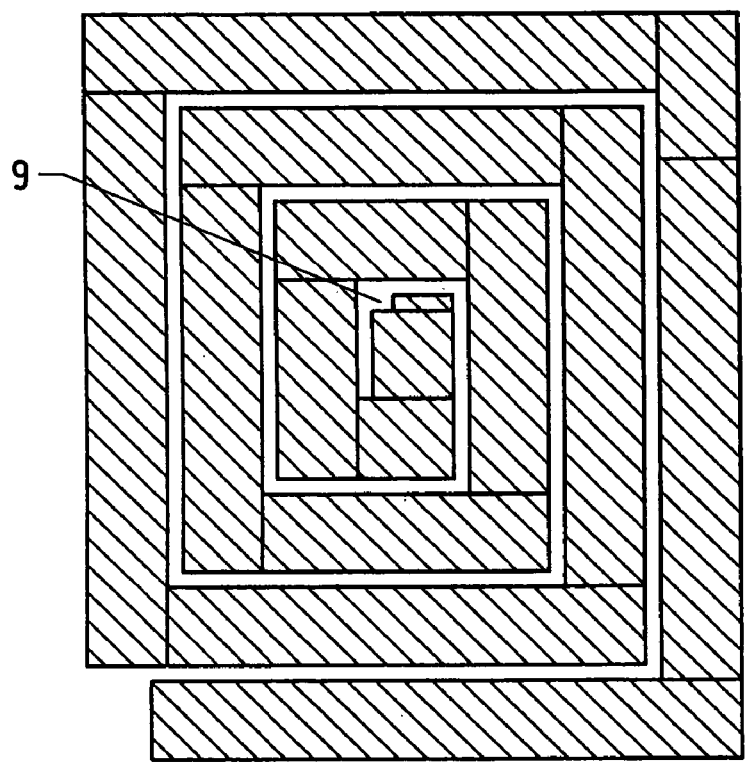
FIGS. 7A and 7B show the rectangular spiral resonator used in Examples 5-7 and the locations of the material removed.
Figure 7B:
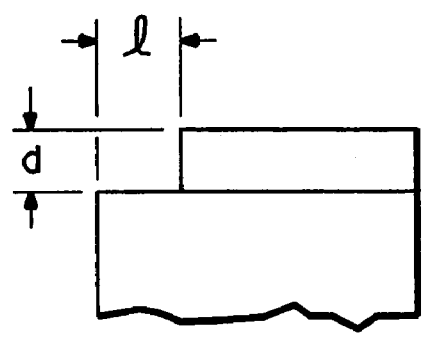
Figure 8:
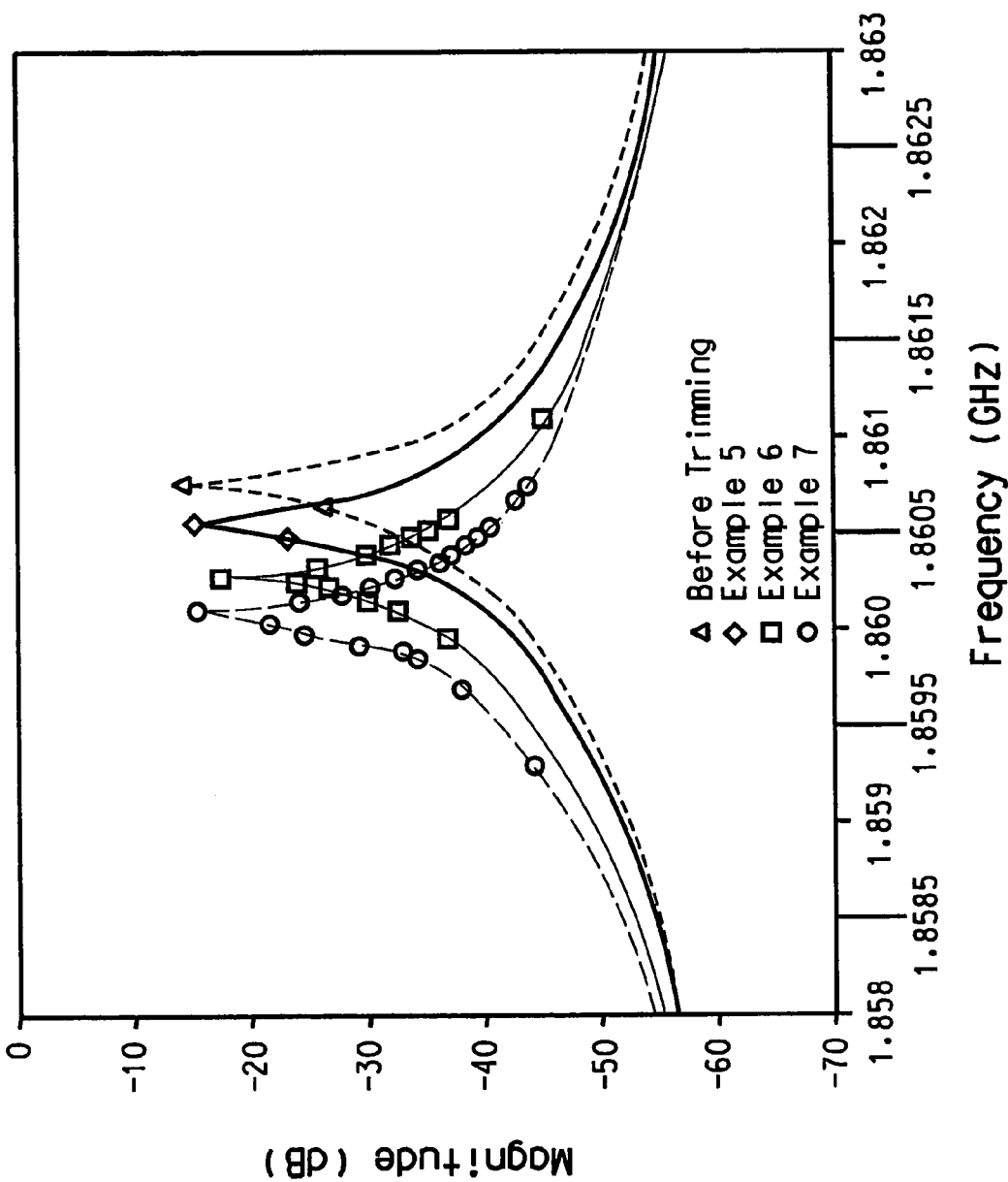
FIG. 8 shows the resonance curves and frequencies for Examples 5-7.

As shown in FIG. 7A, for Examples 5-7 material is removed at the inner end 9 of the resonator to simulate the removal of HTS material there by laser ablation. The location of removal is shown in detail in FIG. 7B where the amount of material removed is shown to be a cut of depth d and length 1. In each example, the depth of the material removed is the same, i.e. d=44 μm. The lengths 1 of the cuts are 44 μm for Example 5, 88 μm for Example 6 and 132 μm for Example 7. The resonance frequency is determined for the spiral resonator of each of the examples. The resonance frequencies are 1.8605 GHz for Example 5, 1.8603 GHz for Example 6 and 1.8600 GHz for Example 7. The resonance curves and frequencies are shown in FIG. 8. The decreases in resonance frequency from the untrimmed resonance frequency are summarized in Table II.

TABLE II

| Example | Trimming Size (μm) | Decrease in Resonance Frequency (MHz) |
|---|---|---|
| 5 | 44 × 44 | 0.2 |
| 6 | 44 × 88 | 0.4 |
| 7 | 44 × 132 | 0.7 |

These examples demonstrate the decrease in the resonance frequency of a spiral resonator when material is ablated from the inner end of the spiral. The resonance frequency decreased more as more material is removed. This method of tuning the resonance frequency is subject to the proviso that the depth d of the area to be trimmed at the inner end of the spiral of the resonator is small compared to the wavelength λ of the propagating electromagnetic wave, i.e. that the depth d is less than about λ/50. If extensive trimming is carried out at the inner end of the spiral, i.e. such that the depth d is greater than about λ/50, the resonance frequency will increase with increased trimming.

EXAMPLES 8-16

These examples are carried out using the same Sonnet EM software and the same rectangular spiral resonator and substrate used in Examples 2-4. As for the resonator of Examples 2-4, the resonance frequency of the spiral resonator with no material removed is 1.8607 GHz.

Figure 9A:
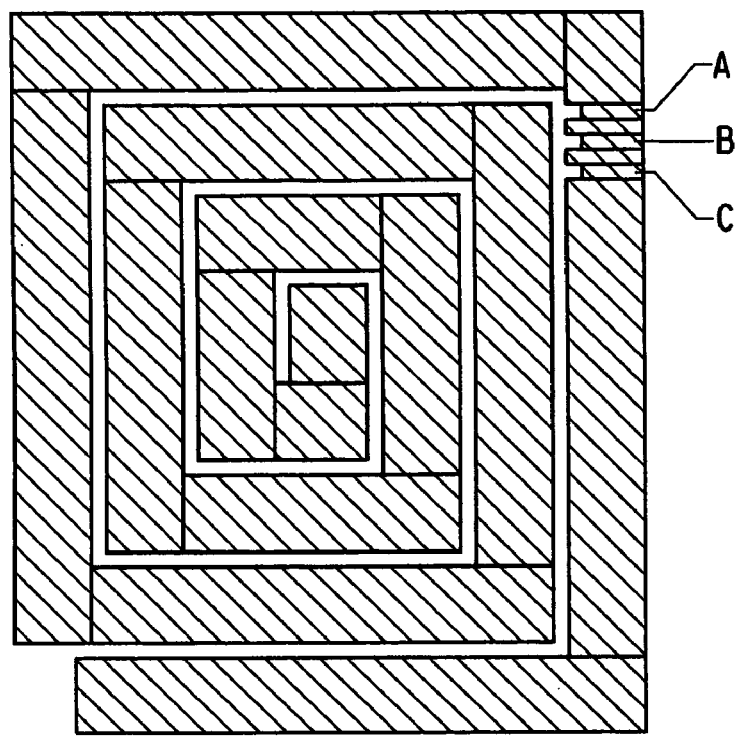
FIGS. 9A and 9B show the rectangular spiral resonator used in Examples 8-16 and the locations of the material removed.
Figure 9B:
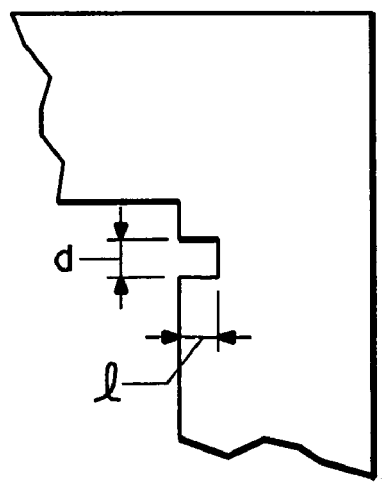

As shown in FIG. 9A, for Examples 8-16 material is removed near a corner at the inner edge of the HTS spiral line of the resonator to simulate the removal of HTS material there by laser ablation. The three locations at which material is removed are shown as A, B and C on FIG. 9A. Examples 8-10 are carried out at location A. Examples 11-13 are carried out at location B. Examples 14-16 are carried out at location C. The material removed is shown in detail in FIG. 9B where the amount of material removed is shown to be a cut of width d and length 1. In each example, the width of the material removed is the same, i.e. d=44 μm. The lengths 1 of the cuts are 44 μm for Examples 8, 11 and 14, 88 μm for Examples 9, 12 and 15 and 132 μm for Examples 10. The resonance frequency is determined for the spiral resonator of each of the examples. The resonance curves are similar in shape to those shown in FIGS. 6 and 8. The resonance frequencies and the decreases in resonance frequency from the untrimmed resonance frequency are summarized in Table III.

TABLE III

| Example | Trimming Size (μm) | Decrease in Resonance Frequency (MHz) | Resonance Frequency (GHz) |
|---|---|---|---|
| 8 | 44 × 44 | 0.4 | 1.8603 |
| 9 | 44 × 88 | 1.2 | 1.8595 |
| 10 | 44 × 132 | 2.3 | 1.8584 |
| 11 | 44 × 44 | 0.1 | 1.8606 |
| 12 | 44 × 88 | 0.8 | 1.8599 |
| 13 | 44 × 132 | 1.6 | 1.8591 |
| 14 | 44 × 44 | 0.0 | 1.8607 |
| 15 | 44 × 88 | 0.5 | 1.8602 |
| 16 | 44 × 132 | 1.2 | 1.8595 |

These examples demonstrate the decrease in the resonance frequency of a spiral resonator when material is ablated from an interior location on the inner edge of the spiral where there are higher current densities. Ablation is most effective in reducing the resonance frequency for location A, which is closest to the corner and where a higher current density is expected. Location B is farther from the corner with a smaller current density and showed smaller decreases in resonance frequency for the same degree of ablation. Location C is farthest from the corner with the smallest current density and showed the smallest decreases in resonance frequency for the same degree of ablation. The decrease in resonance frequency for Example 14 is less than 0.1 MHz. At each location, the resonance frequency decreased more as more material is removed.

EXAMPLES 17-20

Figure 10:
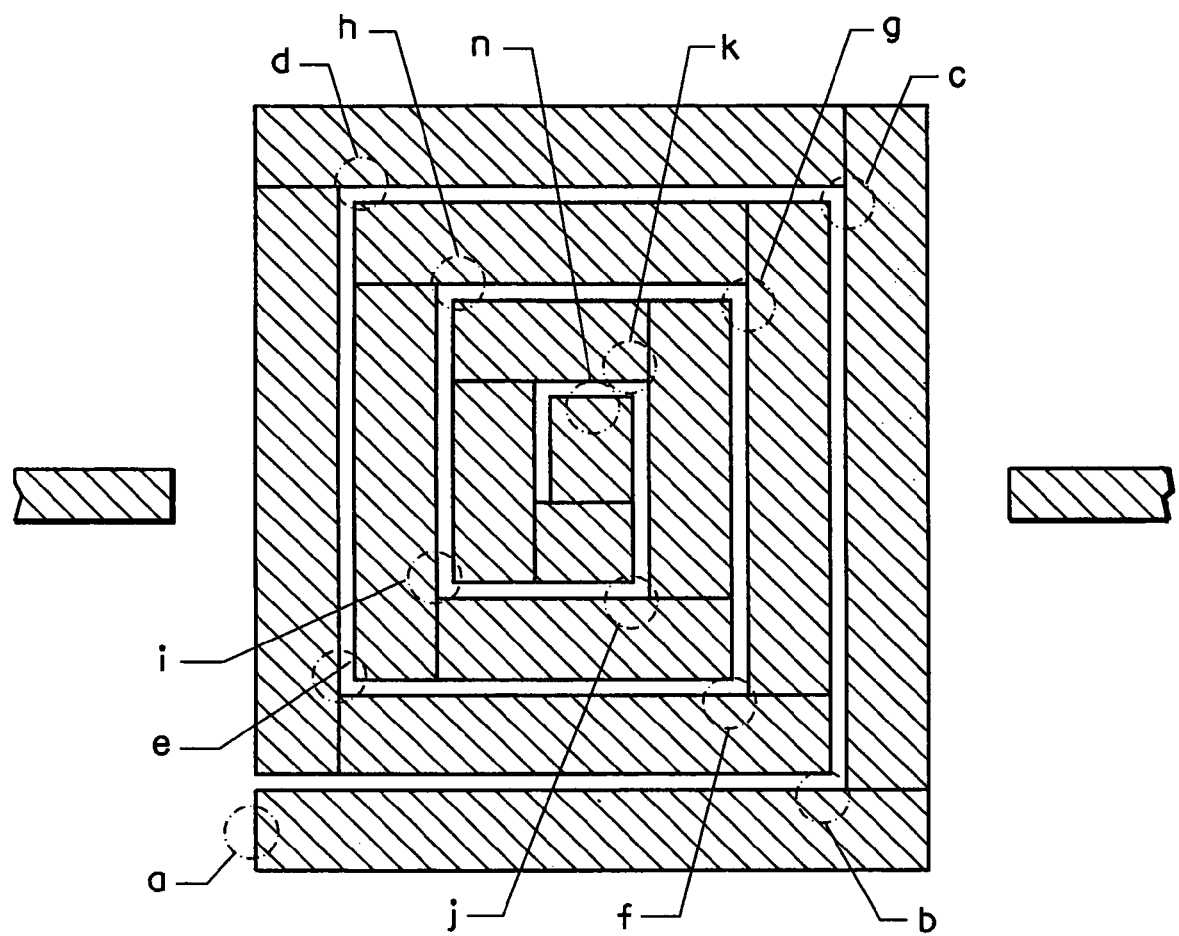
FIG. 10 shows the rectangular spiral resonator used in Examples 17-27 and identifies various locations on the rectangular spiral resonator.

These examples are carried out using Sonnet EM software, obtained from Sonnet Software, Inc., Liverpool, N.Y. 13088, to simulate the performance of a HTS spiral resonator and demonstrate the changes in the resonance frequency of the HTS spiral resonator for various amounts of ablation at the outer end of the spiral. The following model is used. The substrate had a thickness of 0.508 mm and a dielectric constant of 24 and had a front side and a back side. The spiral resonator is in intimate contact with the front side of the substrate. A ground plane, which in practice would be a blank, i.e. continuous, HTS film, is on the back side of the substrate. The circuit box size is 11.264 mm×7.48 mm×5.0 mm. A rectangular spiral resonator shown in FIG. 10 is chosen for the simulation. The line widths of the spiral resonator are 308 μm with a gap of 44 μm between lines. The resonance frequency of the spiral resonator with no material removed is 1.88671 GHz. Various locations on the spiral resonator are indicated by the letters a-n on FIG. 10.

Figure 11:
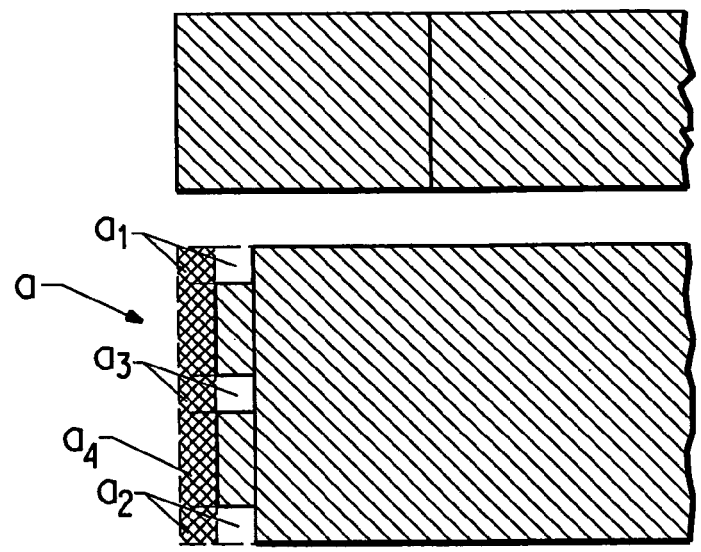
FIG. 11 shows an enlarged view of the outer end of the rectangular spiral resonator shown in FIG. 10 and the locations of material removed in Examples 17-20.

FIG. 11 is an enlarged view of location a, the outer end of the HTS spiral line shown in FIG. 10. As shown in FIG. 11, for Examples 17-20, material is removed to simulate the removal of HTS material there by laser ablation. The amount of material removed in Examples 17, 18 and 19 is a cut 44 μm wide and 88 μm into the end of the HTS line at locations $a_1$, $a_2$ and $a_3$, respectively, as shown in FIG. 11. The amount of material removed in Example 20 is a cut 44 μm into the end of the HTS line across the whole width of the HTS line and indicated by the cross-hatched area $a_4$ of FIG. 11. The resonance frequency is determined for the spiral resonator of each of the Examples. The resonance curves are similar in shape to those shown in FIGS. 6 and 8. The resonance frequencies and the increases in resonance frequency from the untrimmed resonance frequency are summarized in Table IV.

TABLE IV

| Example | Increase in Resonance Frequency (MHz) | Resonance Frequency (GHz) |
|---|---|---|
| 17 | 1.83 | 1.88854 |
| 18 | 1.01 | 1.88772 |
| 19 | 0.21 | 1.88692 |
| 20 | 4.38 | 1.89109 |

These examples demonstrate the increase in the resonance frequency of a spiral resonator when material is ablated from the outer end of the spiral. The magnitude of the increase depends upon the location of the ablation and the amount of material removed.

EXAMPLES 21-24

These examples are carried out using the same Sonnet EM software and the same rectangular spiral resonator and substrate used in Examples 17-20. As for the resonator of Examples 17-20, the resonance frequency of the spiral resonator with no material removed is 1.88671 GHz.

Figure 12:
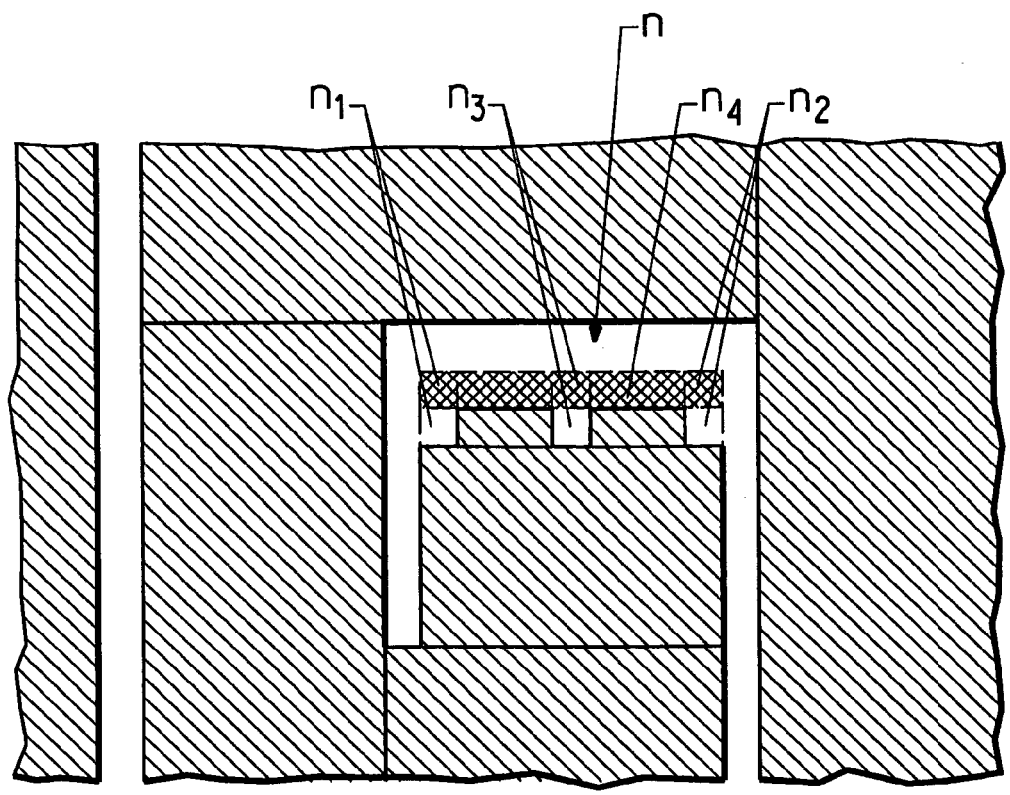
FIG. 12 shows an enlarged view of the inner end n of the rectangular spiral resonator shown in FIG. 10 and the locations of material removed in Examples 21-24.

FIG. 12 is an enlarged view of location n, the inner end of the HTS spiral line shown in FIG. 10. As shown in FIG. 12, for Examples 21-24, material is removed to simulate the removal of HTS material there by laser ablation. The amount of material removed in Examples 21, 22 and 23 corresponds to a cut 44 μm wide and 88 μm into the end of the HTS line at locations $n_1$, $n_2$ and $n_3$, respectively, as shown in FIG. 12. The amount of material removed in Example 24 corresponds to a cut 44 μm into the end of the HTS line across the whole width of the HTS line and indicated by the cross-hatched area $n_4$ of FIG. 12. The resonance frequency is determined for the spiral resonator of each of the examples. The resonance curves are similar in shape to those shown in FIGS. 6 and 8. The resonance frequencies and the decreases in resonance frequency from the untrimmed resonance frequency are summarized in Table V.

TABLE V

| Example | Decrease in Resonance Frequency (MHz) | Resonance Frequency (GHz) |
|---|---|---|
| 21 | 0.55 | 1.88616 |
| 22 | 0.53 | 1.88618 |
| 23 | 1.38 | 1.88533 |
| 24 | 1.60 | 1.88511 |

These examples demonstrate the decrease in the resonance frequency of a spiral resonator when material is ablated from the inner end of the spiral. The magnitude of the decrease depends upon the location of the ablation and the amount of material removed.

EXAMPLE 25

This example is carried out using the same Sonnet EM software and the same rectangular spiral resonator and substrate used in Examples 17-20. As for the resonator of Examples 17-20, the resonance frequency of the spiral resonator with no material removed is 1.88671 GHz.

Material is removed from the inner edge of the HTS spiral line at the interior locations b-k shown in FIG. 10 to simulate the removal of HTS material at these locations by laser ablation. Each of these locations is near a corner of the HTS spiral resonator. The amount of material removed at each location is a cut 44 μm wide and 88 μm deep. The cut began 99 μm away from the nearest corner to the location indicated and is 44 μm wide. It extended 88 μm into the spiral line. One such cut is shown at g in FIG. 13. The resonance frequency is determined for the spiral resonator with the material removed at each of the similar locations near the corners b-k shown in FIG. 10. The resonance curves are similar in shape to those shown in FIGS. 6 and 8. The shift in the resonance frequency observed as a result of trimming only at the location indicated is plotted in FIG. 14 for each of the locations b-k. Current density data is obtained by simulating a 1 volt source applied to the spiral resonator with no material removed. Peak current density is readily obtained from simulation data, and is used herein as a measure of current density. An alternative, however, would be to use the average current density at the area being trimmed as a measure of current density rather than peak current density. The current densities obtained using the software are linear current densities. The peak current density, with no material removed, at each of the locations b-k is also plotted in FIG. 14.

For location b, there is a small current density and a small positive frequency shift, i.e. a small increase in resonance frequency. For all other locations the current density is relatively higher and there is a negative frequency shift, i.e. a decrease in resonance frequency. Location g has the highest current density and the largest decrease in resonance frequency. This example demonstrates that the spiral resonator resonance frequency can be adjusted by trimming at various interior locations and that the amount of adjustment, for a given amount of material remove, depends on the location of the trimming, i.e. on the current density at that location.

EXAMPLE 26

This example is carried out using the same Sonnet EM software and the same rectangular spiral resonator and substrate used in Examples 17-20. As for the resonator of Examples 17-20, the resonance frequency of the spiral resonator with no material removed is 1.88671 GHz.

Figure 13:
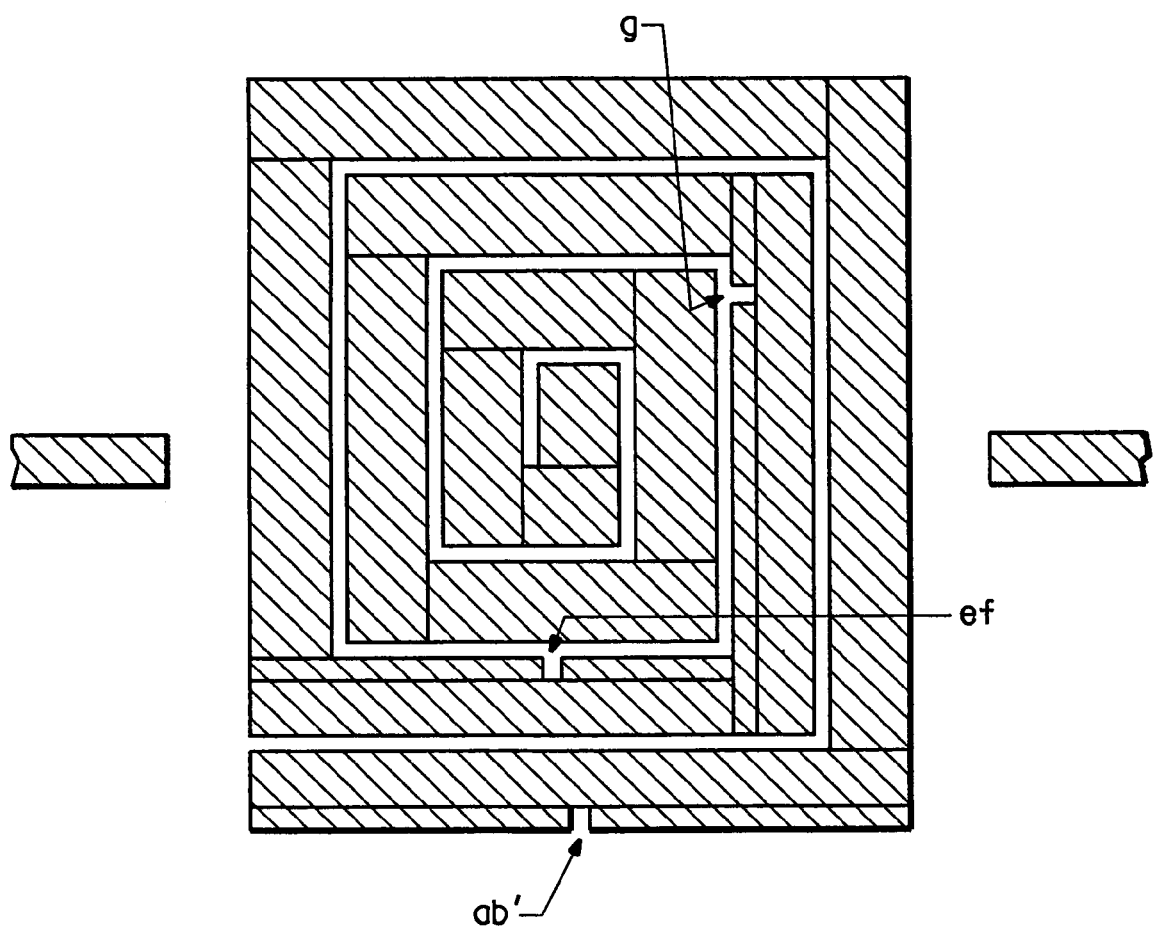
FIG. 13 shows the rectangular spiral resonator of FIG. 10 with typical locations of material removed in Examples 25-27.
Figure 14:
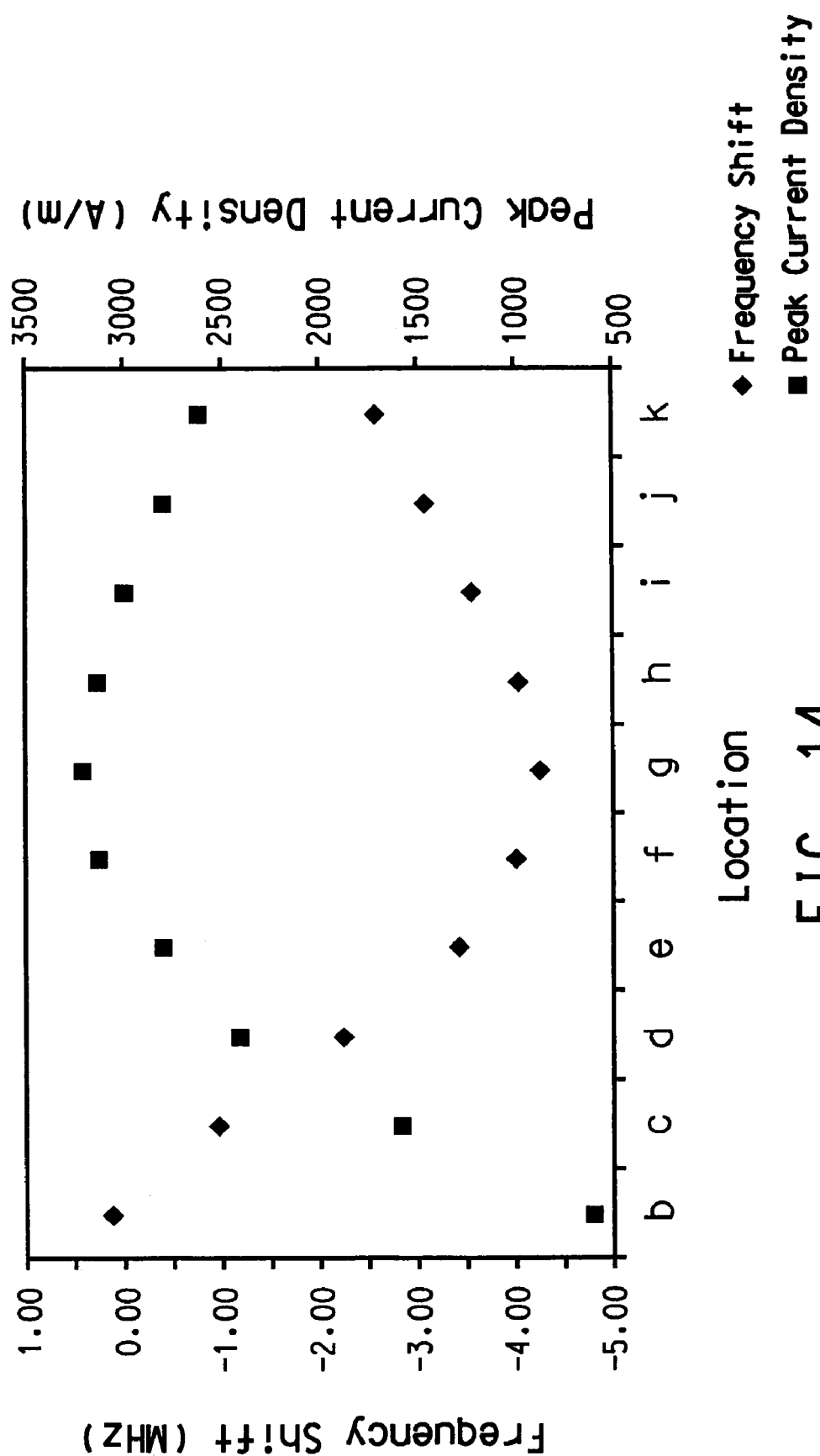
FIG. 14 shows plots of the shift in resonance frequency and the peak current density for each of the near corner locations where material was removed in Example 25.
Figure 15:
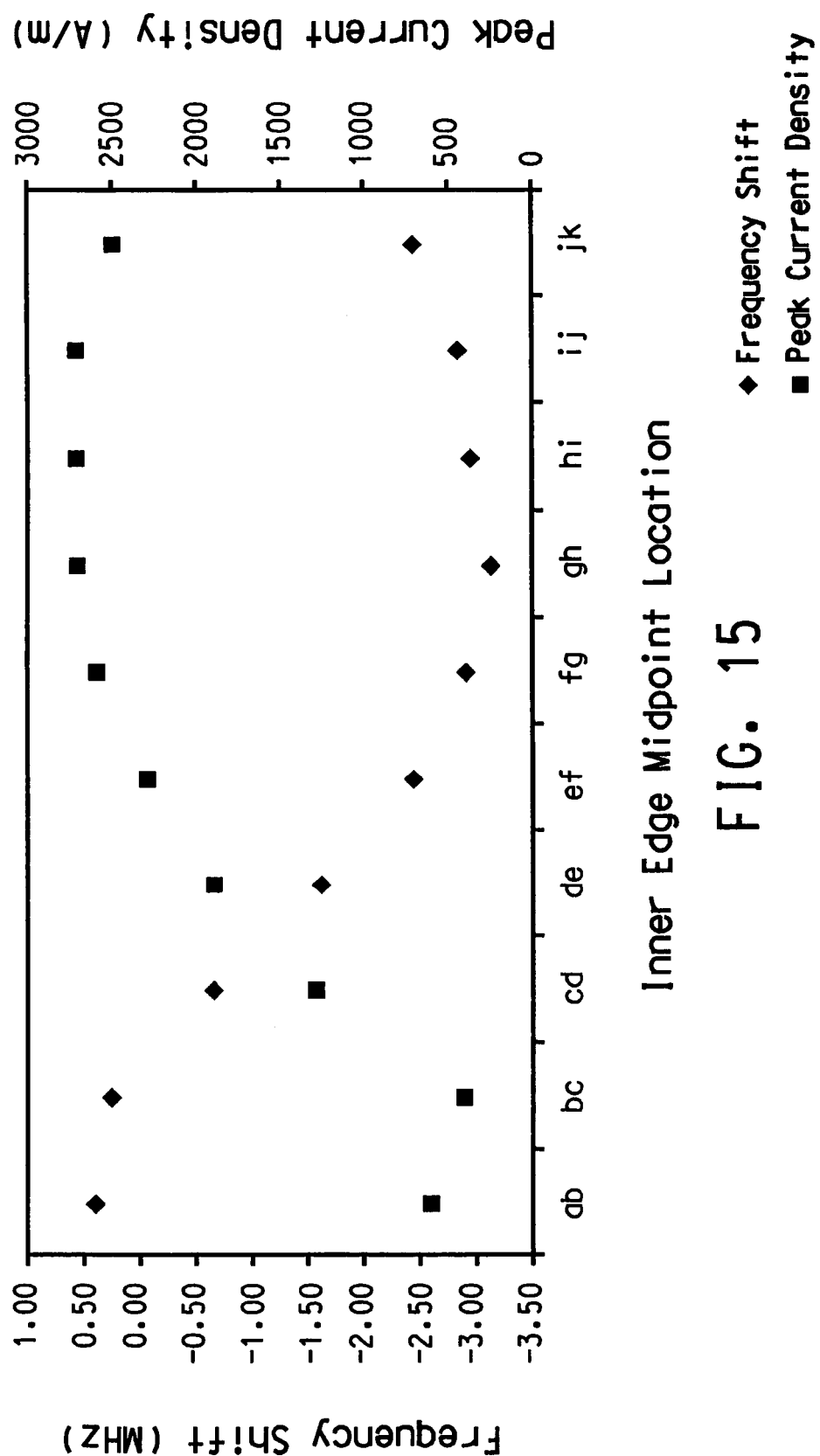
FIG. 15 shows plots of the shift in resonance frequency and the peak current density for each of the inner edge elocations where material was removed in Example 26.

Material is removed from the inner edge of the HTS spiral line at interior locations that are midway between the corners b-k shown in FIG. 10 to simulate the removal of HTS material at these locations by laser ablation. The inner edge midpoint between end a and corner b is designated as ab, the inner edge midpoint between corner b and corner c is designated by bc, etc. The amount of material removed at each inner edge midpoint location is a cut 44 μm wide extending 88 μm into the spiral line. One such cut for the inner edge midpoint between the corners e and f, i.e. location ef, is shown in FIG. 13. The resonance frequency is determined for the spiral resonator with the material removed at each of the inner edge midpoint locations ab-jk. The resonance curves are similar in shape to those shown in FIGS. 6 and 8. The shift in the resonance frequency observed as a result of trimming only at the location indicated is plotted in FIG. 15 for each of the inner edge midpoint locations ab-jk. Current density data is obtained as described in Example 25 and the peak current density, with no material removed, at each of the locations ab-jk is also plotted in FIG. 15.

For locations ab and bc, there are small current densities and small positive frequency shifts, i.e. small increases in resonance frequency. For all other locations the current density is relatively higher, and there is a negative frequency shift, i.e. a decrease in resonance frequency. The locations with the higher current densities have larger decreases in resonance frequency. This example demonstrates that the spiral resonator resonance frequency can be adjusted by trimming at various interior locations and that the amount of adjustment, for a given amount of material remove, depends on the location of the trimming, i.e. on the current density at that location.

EXAMPLE 27

This example is carried out using the same Sonnet EM software and the same rectangular spiral resonator and substrate used in Examples 17-20. As for the resonator of Examples 17-20, the resonance frequency of the spiral resonator with no material removed is 1.88671 GHz.

Figure 16:
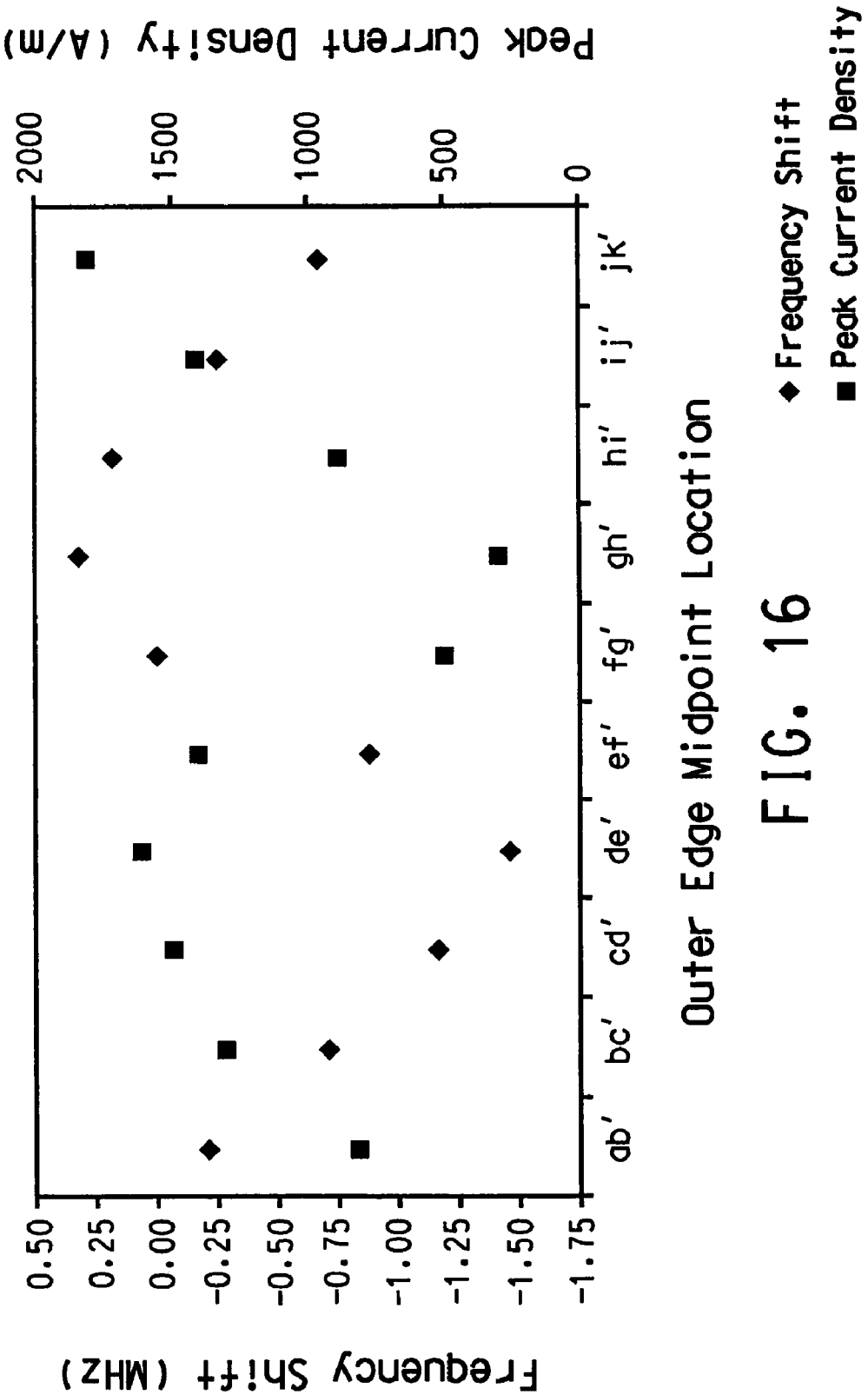
FIG. 16 shows plots of the shift in resonance frequency and the peak current density for each of the outer edge locations where material was removed in Example 27.

Material is removed from the outer edge of the HTS spiral line at interior locations that are midway between the corners b-k shown in FIG. 10 to simulate the removal of HTS material at these locations by ablation. The outer edge midpoint between end a and corner b is designated as ab', the outer edge midpoint between corner b and corner c is designated by bc', etc. The amount of material removed at each outer edge midpoint location is a cut 44 μm wide extending 88 μm into the spiral line. One such cut for the outer edge midpoint between the end a and the corner b, i.e. location ab', is shown in FIG. 13. The resonance frequency is determined for the spiral resonator with the material removed at each of the outer edge midpoint locations ab'-jk'. The resonance curves are similar in shape to those shown in FIGS. 6 and 8. The shift in the resonance frequency observed as a result of trimming only at the location indicated is plotted in FIG. 16 for each of the outer edge midpoint locations ab'-jk'. Current density data is obtained as described in Example 25 and the peak current density, with no material removed, at each of the locations ab'-jk' is also plotted in FIG. 16.

The dependence of the peak current density with outer edge midpoint locations along the spiral line varies considerably. The current density has a moderate magnitude at ab', toward the outer end of the spiral line, increases through a maximum at location de', decreases to a minimum at gh' and then increases along the spiral line toward the inner end. The frequency shift changes correspondingly. For locations along the outer portion of the spiral line the frequency shifts are negative, i.e. there are decreases in resonance frequency. The frequency shift is small and positive for gh' and then becomes negative for locations closer to the inner end of the spiral line. This example demonstrates that the spiral resonator resonance frequency can be adjusted by trimming at various interior locations, and that the amount of adjustment, for a given amount of material remove, depends on the location of the trimming, i.e. on the current density at that location.

Comparison with Example 26 shows that trimming by the same amount at a given location along the spiral line can result in quite different results depending on whether the tuning is along the inner edge of the line or the outer edge. Trimming at inner edge locations gh and hi in Example 26 resulted in large decreases in the resonance frequency. Trimming at outer edge locations gh' and hi' in Example 27 resulted in small increases in the resonance frequency. In contrast, trimming at inner edge de and outr edge de' resulted in about the same decrease in resonance frequency.

Figure 17:
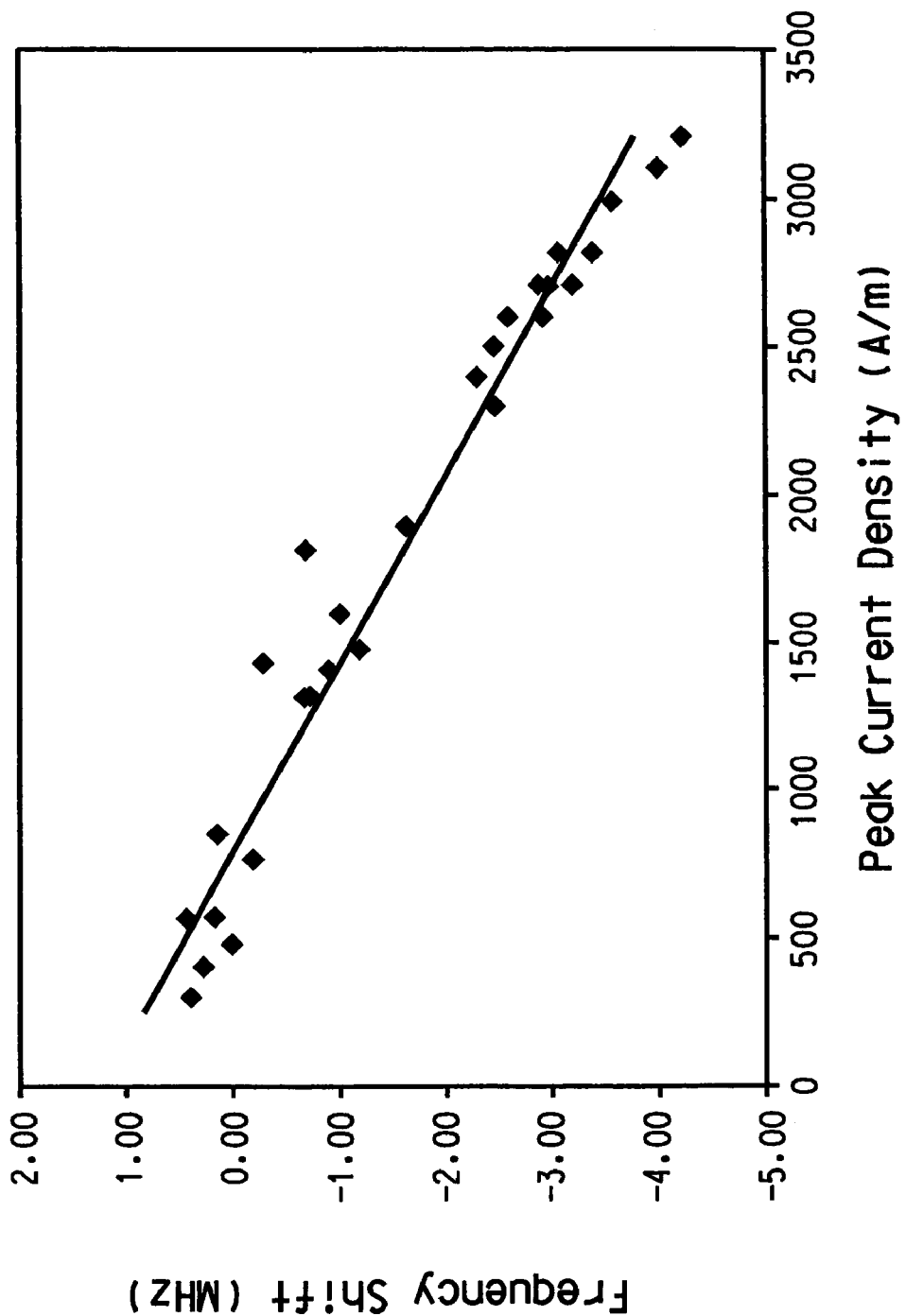
FIG. 17 is a plot of the frequency shifts observed in Examples 25, 26 and 27 versus the peak current density at the location where material was removed.

To demonstrate the importance of the current density in determining the effect on the resonance frequency of a given amount of trimming at interior locations along the spiral line, FIG. 17 shows a plot of the frequency shifts observed at the various locations in Examples 25, 26 and 27 versus the peak current densities at those locations. The resulting shifts from trimming at interior points along the spiral line is approximately linearly dependent on the peak current density at the location of the trim as shown by the line drawn on FIG. 17. It is believed that if the frequency shift had been plotted versus average current density the linear fit would be even better.

EXAMPLE 28

This example demonstrates the use of the laser trimming method of the invention to lower the center frequency of the band-pass region of an 8-pole filter with the design shown in FIG. 1, while holding the bandwidth of the band-pass region of the filter essentially constant.

The 8-pole HTS filter is produced using essentially the same procedure as used in Example 1.

The filter is mounted and preparations for trimming are made as described above.

Figure 18:
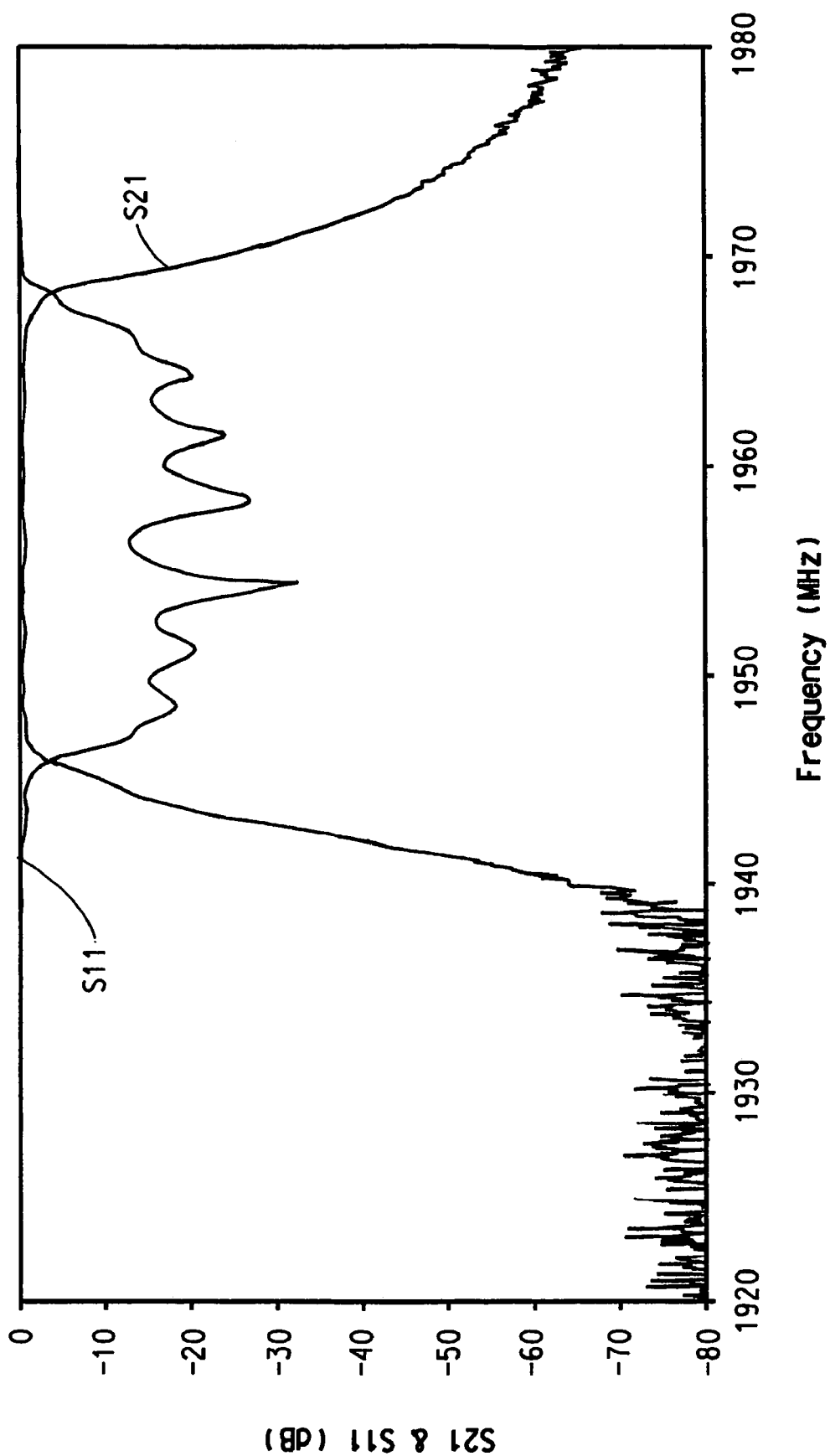
FIG. 18 shows the $S_{21}$ and the $S_{11}$ of the 8-pole filter of Example 28 before the laser trimming of the invention.

$S_{11}$ and $S_{21}$ are measured for the filter before laser trimming and the results are shown in FIG. 18.

The spiral resonators of the filter underwent laser trimming in a manner similar to that described in Example 1. However, since the goal in this example is to lower the center frequency of the band-pass while holding the bandwidth of the band-pass region of the filter essentially constant, trimming is begun at an inner corner of the spiral of the first spiral resonator where the current density is sufficiently high so that trimming would result in a decrease of the resonance frequency. Trimming continued at this inner corner as long as performance improved. Trimming is then shifted to the outer end of the spiral to determine if trimming there improved performance. Each of the 8 spiral resonators is trimmed in a similar manner. The process of trimming all 8 spiral resonators is repeated 6 more times. Larger frequency shifts are accomplished with the first few iterations, and finer tuning and improvements in $S_{11}$ and $S_{21}$ are accomplished with the later iterations.

Figure 19:
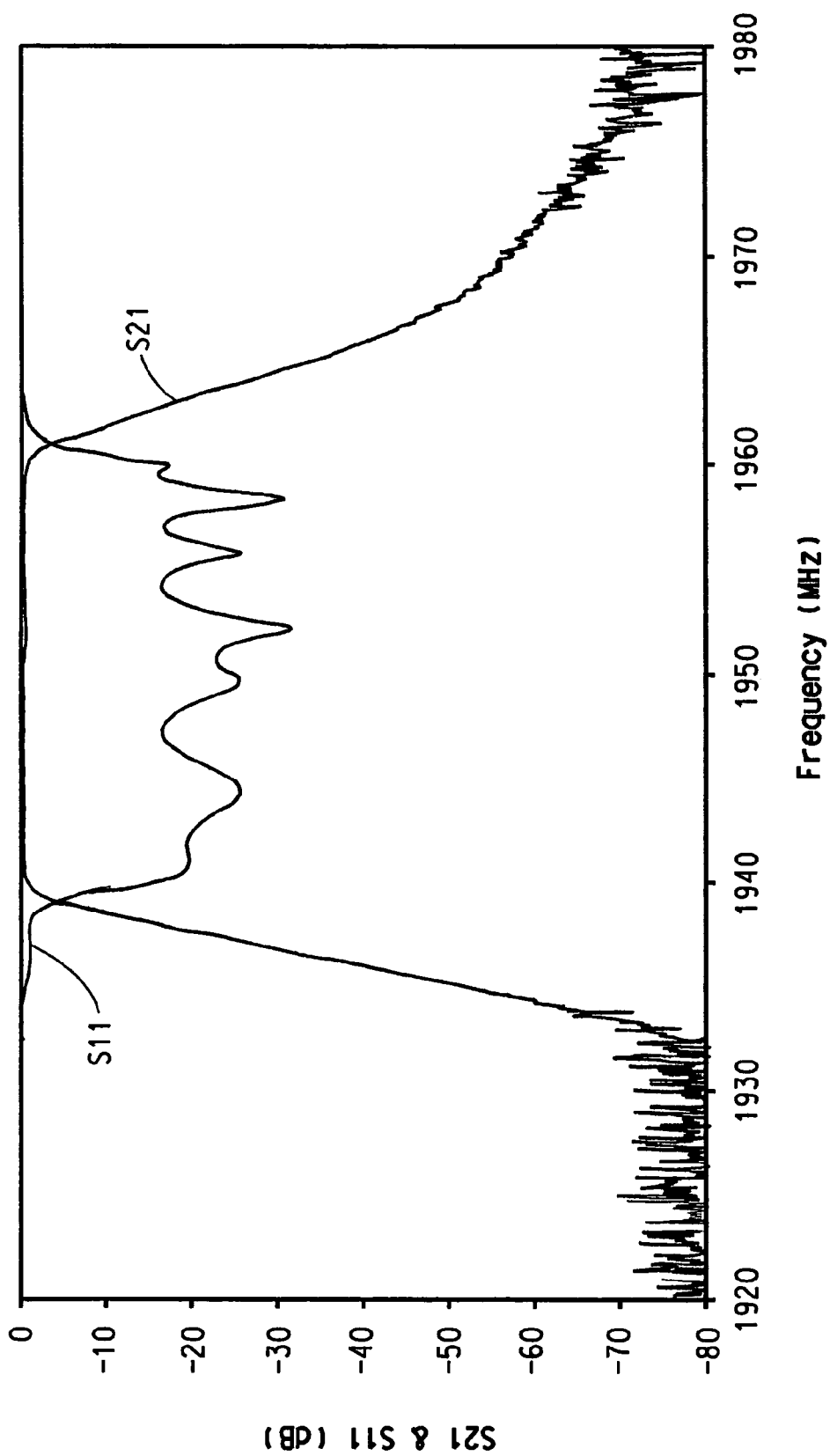
FIG. 19 shows the $S_{21}$ and the $S_{11}$ of the 8-pole filter of Example 28 after the laser trimming of the invention.

$S_{11}$ and $S_{21}$ are measured for the filter after laser trimming, and the results are shown in FIG. 19. Comparison with the results shown in FIG. 18 for these coefficients before trimming show that the center frequency is shifted downward about 6 MHz. The magnitude of $S_{11}$ in the band-pass region has also been lowered resulting in improved filter performance. The bandwidth of the band-pass region remains essentially unchanged.

EXAMPLE 29

This example demonstrates the use of the laser trimming method of the invention to raise the center frequency of the band-pass region of an 8-pole filter with the design shown in FIG. 1, while holding the bandwidth of the band-pass region of the filter essentially constant.

The 8-pole HTS filter is produced using essentially the same procedure as used in Example 1.

The filter is mounted and preparations for trimming are made as described above.

Figure 20:
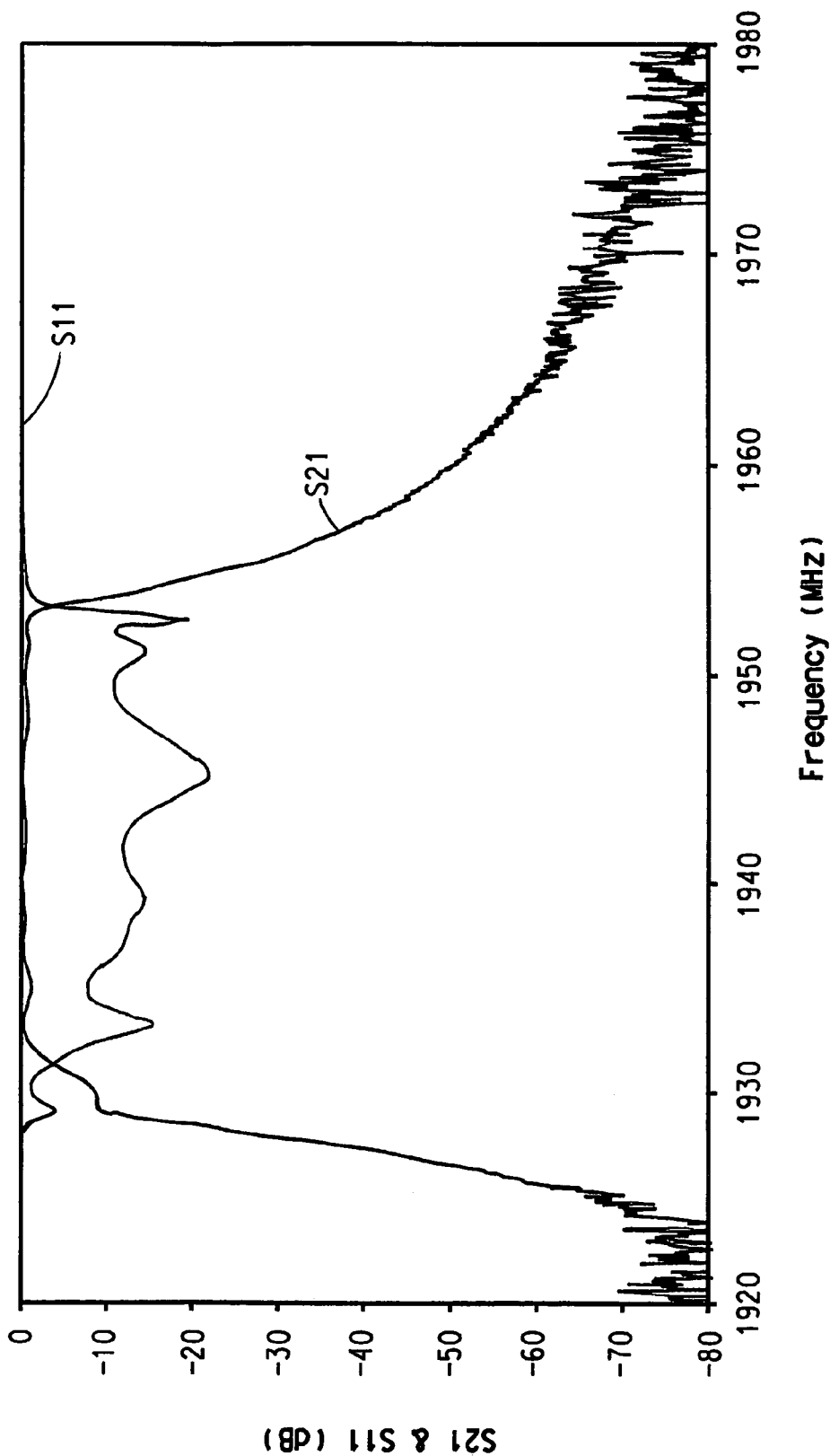
FIG. 20 shows the $S_{21}$ and the $S_{11}$ of the 8-pole filter of Example 29 before the laser trimming of the invention.

$S_{11}$ and $S_{21}$ are measured for the filter before laser trimming and the results are shown in FIG. 20.

The spiral resonators of the filter underwent laser trimming in a manner analogous to that described in Example 1. Since the goal in this Example is to raise the center frequency of the band-pass while holding the bandwidth of the band-pass region of the filter essentially constant, trimming is begun at the outer end of the spiral of the first spiral resonator in order to raise the resonance frequency of that resonator. Trimming continued at this outer end as long as performance improved. Trimming then shifted to an inner corner of the spiral of the first spiral resonator, where the current density is sufficiently high so that trimming would result in a decrease of the resonance frequency, to determine if trimming there improved performance. Each of the 8 spiral resonators is trimmed in a similar manner. The process of trimming all 8 spiral resonators is repeated 6 more times. Larger frequency shifts are accomplished with the first few iterations, and finer tuning and improvements in $S_{11}$ and $S_{21}$ are accomplished with the later iterations.

Figure 21:
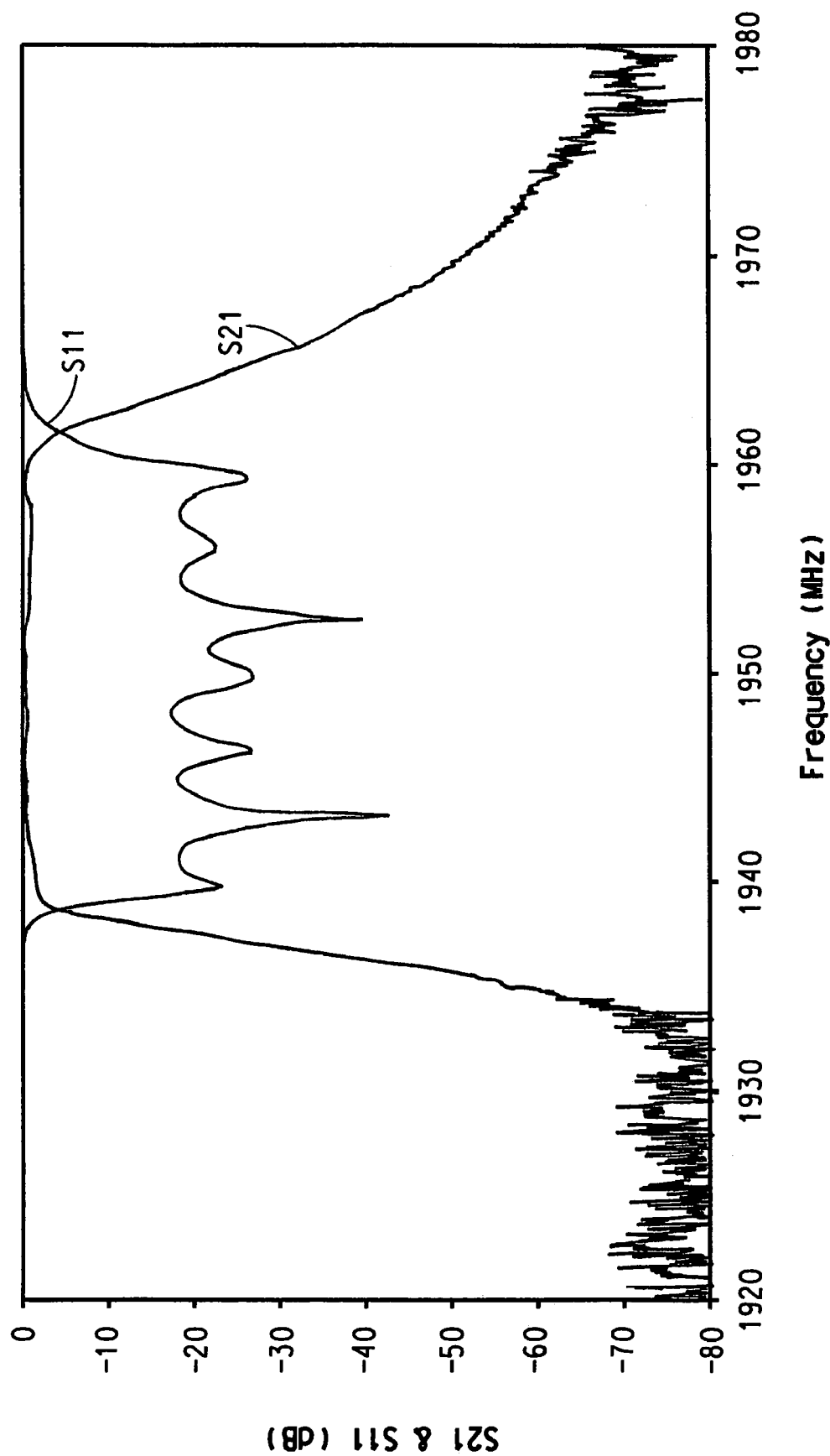
FIG. 21 shows the $S_{21}$ and the $S_{11}$ of the 8-pole filter of Example 29 after the laser trimming of the invention.

$S_{11}$ and $S_{21}$ are measured for the filter after laser trimming, and the results are shown in FIG. 21. Comparison with the results shown in FIG. 20 for these coefficients before trimming shows that the center frequency is shifted upward about 7 MHz. The magnitude of $S_{11}$ in the band-pass region has been lowered resulting in improved performance. The bandwidth of the band-pass region remains essentially unchanged.

EXAMPLE 30

This example demonstrates the use of the laser trimming method of the invention to improve the characteristics of the band-pass region of an 8-pole filter with the design shown in FIG. 1, while holding the center frequency and the bandwidth of the band-pass region of the filter essentially constant.

The 8-pole HTS filter is produced using essentially the same procedure as used in Example 1.

The filter is then mounted and preparations for trimming are made as described above.

Figure 22:
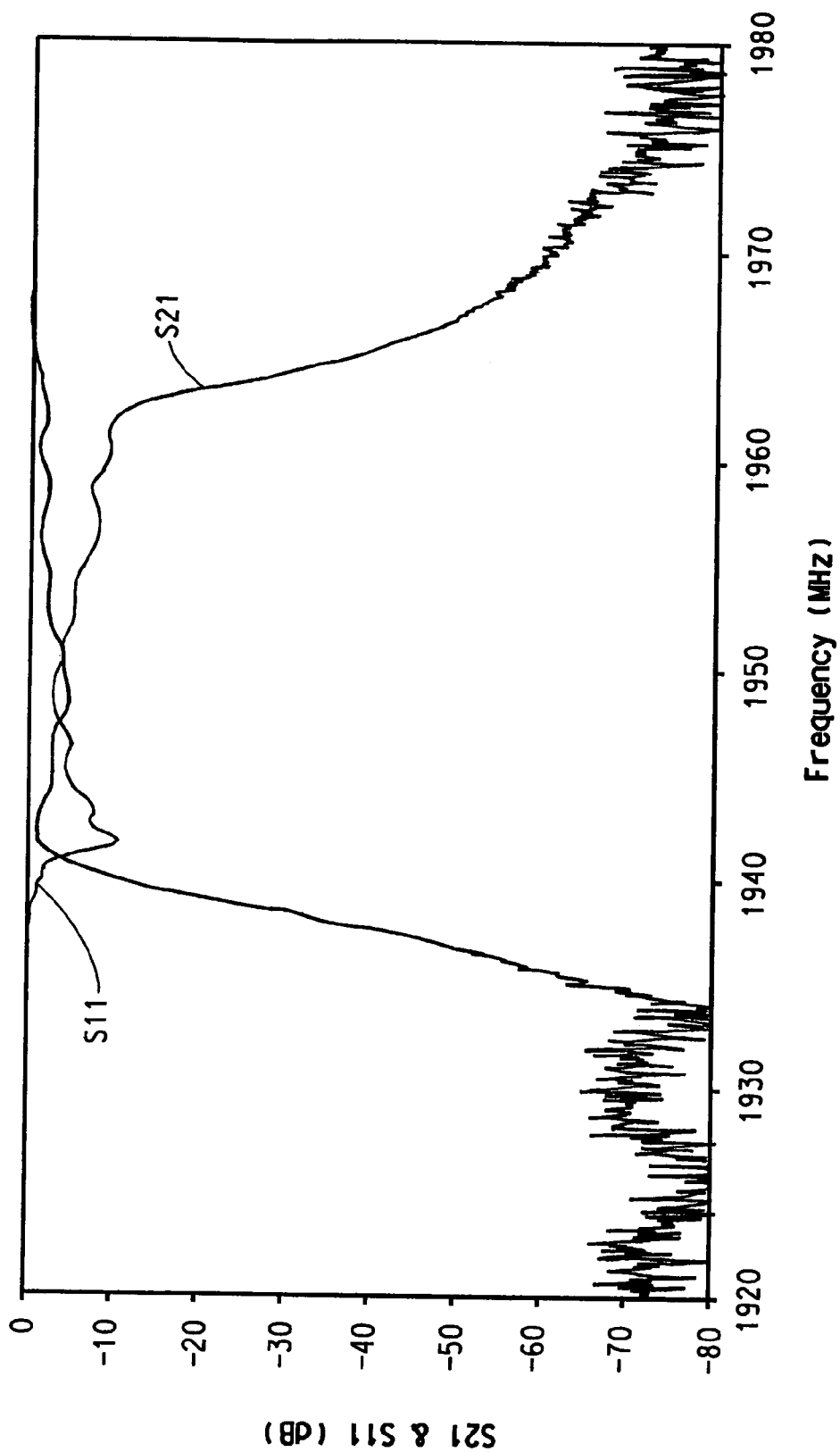
FIG. 22 shows the $S_{21}$ and the $S_{11}$ of the 8-pole filter of Example 30 before the laser trimming of the invention.

$S_{11}$ and $S_{21}$ are measured for the filter before laser trimming and the results are shown in FIG. 22.

Since the goal in this Example is the same as that of Example 1, i.e. to improve the characteristics of the band-pass region of an 8-pole filter with the design shown in FIG. 1, while holding the center frequency and the bandwidth of the band-pass region of the filter essentially constant, the spiral resonators of the filter underwent laser trimming essentially as described in Example 1.

Figure 23:
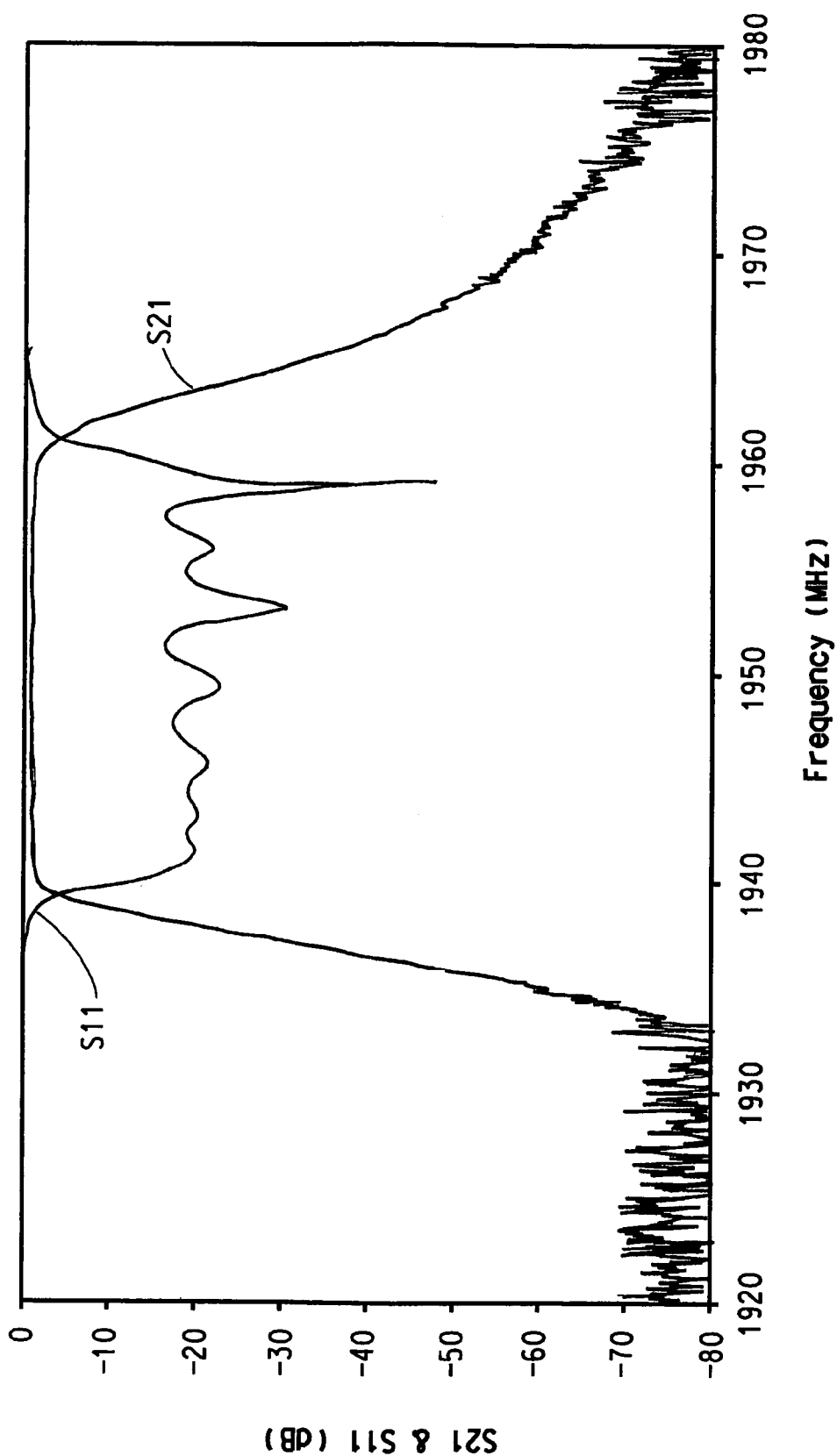
FIG. 23 shows the $S_{21}$ and the $S_{11}$ of the 8-pole filter of Example 30 after the laser trimming of the invention.

$S_{11}$ and $S_{21}$ are measured for the filter after laser trimming and the results are shown in FIG. 23. Comparison with the results shown in FIG. 22 for these coefficients before trimming show that the center frequency and the bandwidth of the band-pass region remain essentially unchanged. However, the magnitude of $S_{11}$ in the band-pass region has been lowered, and the magnitude of $S_{21}$ in the band-pass region has been raised resulting in improved filter performance.

Where an apparatus or method of this invention is stated or described as comprising, including, containing, having, being composed of or being constituted by certain components or steps, it is to be understood, unless the statement or description explicitly provides to the contrary, that one or more components or steps other than those explicitly stated or described may be present in the apparatus or method. In an alternative embodiment, however, the apparatus or method of this invention may be stated or described as consisting essentially of certain components or steps, in which embodiment components or steps that would materially alter the principle of operation or the distinguishing characteristics of the apparatus or method would not be present therein. In a further alternative embodiment, the apparatus or method of this invention may be stated or described as consisting of certain components or steps, in which embodiment components or steps other than those as stated would not be present therein.

Where the indefinite article "a" or "an" is used with respect to a statement or description of the presence of a component in an apparatus, or a step in a method, of this invention, it is to be understood, unless the statement or description explicitly provides to the contrary, that the use of such indefinite article does not limit the presence of the component in the apparatus, or of the step in the method, to one in number.

What is claimed is:

1. A method for increasing the resonance frequency of a high temperature superconductor spiral resonator, comprising ablating a portion of the high temperature superconductor spiral of the spiral resonator with a laser beam at one or more of the following locations:
   (a) at the outer end of the high temperature superconductor spiral;
   (b) at the inner end of the high temperature superconductor spiral, wherein the depth d of the area to be trimmed at the inner end of the high temperature superconductor spiral is greater than about $\lambda/50$ where $\lambda$ is the wavelegth of the propagating electromagnetic wave; and
   (c) in at least one interior location of the high temperature superconductor spiral at which the current density is sufficiently low to result in an increase in the resonance frequency as a result of laser ablation.

2. The method of claim 1 wherein the high temperature superconductor spiral is ablated at the outer end thereof.

3. The method of claim 1 wherein the high temperature superconductor spiral is ablated at the inner end thereof, wherein the depth d of the area to be trimmed at the inner end of the high temperature superconductor spiral is greater than about $\lambda/50$ where $\lambda$ is the wavelength of the propagating electromagnetic wave.

4. The method of claim 1 wherein the high temperature superconductor spiral is ablated in at least one interior location thereof at which the current density is sufficiently low to result in an increase the resonance frequency as a result of laser ablation.

5. The method of claim 4 wherein the current density at the interior location is less than about 25% of the maximum current density observed along the high temperature superconductor spiral.

6. A method for decreasing the resonance frequency of a high temperature superconductor spiral resonator, comprising ablating a portion of the high temperature superconductor spiral of the spiral resonator with a laser bean at one or more of the following locations:
   (a) at the inner end of the high temperature superconductor spiral, wherein the depth d of the area to be trimmed at the inner end of the high temperature superconductor spiral is greater than about $\lambda/50$ where $\lambda$ is the wavelength of the propagating electromagnetic wave; and
   (b) in at least one interior location of the high temperature superconductor spiral at which the current density is sufficiently high to result in a decrease in the resonance frequency as a result of laser ablation.

7. The method of claim 6 wherein the high temperature superconductor spiral is ablated at the inner end thereof, wherein the depth d of the area to be trimmed at the inner end of the high temperature superconductor spiral is less than about $\lambda/50$ where $\lambda$ is the wavelength of the propagating electromagnetic wave.

8. The method of claim 6 wherein the high temperature superconductor spiral is ablated in at least one interior location thereof at which the current density is sufficiently high to result in a decrease in the resonance frequency as a result of laser ablation.

9. The method of claim 8 wherein the current density at the interior location is greater than about 25% of the maximum current density observed along the high temperature superconductor spiral.

10. A method for tuning the filter characteristics of a high temperature superconductor filter, which is comprised of at least two high temperature superconductor spiral resonators, the method comprising ablating a portion of the high temperature superconductor spiral of a spiral resonator with a laser beam at one or more of the following locations to increase the resonance frequency of the spiral resonator:
    (a) at the outer end of the high temperature superconductor spiral;
    (b) at the inner end of the high temperature superconductor spiral, wherein the depth d of the area to be trimmed at the inner end of the high temperature superconductor spiral is greater than about $\lambda/50$ where $\lambda$ is the wavelength of the propagating electromagnetic wave; and
    (c) in at least one interior location of the high temperature superconductor spiral at which the current density is sufficiently low to result in a increase in the resonance frequency as a result of laser ablation.

11. The method of claim 10 wherein the high temperature superconductor spiral is ablated at the outer end thereof.

12. The method of claim 10 wherein the high temperature superconductor spiral is ablated at the inner end thereof, wherein the depth d of the area to be trimmed at the inner end of the high temperature superconductor spiral is greater than about $\lambda/50$ where $\lambda$ is the wavelength of the propagating electromagnetic wave.

13. The method of claim 10 wherein the high temperature superconductor spiral is ablated in at least one interior location thereof at which the current density is sufficiently low to result in an increase in the resonance frequency as a result of laser ablation.

14. The method of claim 13 wherein the current density at the interior location is less than about 25% of the maximum current density observed along the high temperature superconductor spiral.

15. The method of claim 10 further comprising a step of decreasing the resonance frequency of a second spiral resonator.

16. The method of claim 10 which provides a resonance frequency of each spiral resonator that is essentially identical to a selected center frequency of the band-pass of the filter.

17. The method of claim 10 further comprising a step of laser trimming a high temperature superconductor inter-resonator coupler.

18. A method for tuning the filter characteristics of a high temperature superconductor filter, which is comprised of at least two high temperature superconductor spiral resonators, the method comprising ablating a portion of the high temperature superconductor spiral of a spiral resonator with a laser beam at one or more of the following locations to decrease the resonance frequency of the spiral resonator:
   (a) at the inner end of the high temperature superconductor spiral, where the depth d of the area to be trimmed at the inner end of the high temperature superconductor spiral is less than about $\lambda/50$ where $\lambda$ is the wavelength of the propagating electromagnetic wave; and
   (b) in at least one interior location of the high temperature superconductor spiral at which the current density is sufficiently high to result in a decrease in the resonance frequency as a result of laser ablation.

19. The method of claim 18 wherein the high temperature superconductor spiral is ablated at the inner end thereof, wherein the depth d of the area to be trimmed at the inner end of the high temperature superconductor spiral is less than about $\lambda/50$ where $\lambda$ is the wavelength of the propagating electromagnetic wave.

20. The method of claim 18 wherein the high temperature superconductor spiral is ablated in at least one interior location thereof at which the current density is sufficiently high to result in a decrease in the resonance frequency as a result of laser ablation.

21. The method of claim 20 wherein the current density at the interior location is greater than about 25% of the maximum current density observed along the high temperature superconductor spiral.

22. The method of claim 18 further comprising a step of increasing the resonance frequency of a second spiral resonator.

23. The method of claim 18 which provides a resonance frequency of each spiral resonator that is essentially identical to a selected center frequency of the band-pass of the filter.

24. The method of claim 18 further comprising a step of laser trimming a high temperature superconductor inter-resonator coupler.

* * * * *

UNITED STATES PATENT AND TRADEMARK OFFICE
CERTIFICATE OF CORRECTION

PATENT NO. : 7,369,010 B2  Page 1 of 1
APPLICATION NO. : 10/992448
DATED : May 6, 2008
INVENTOR(S) : Robby L. Alvarez et al.

It is certified that error appears in the above-identified patent and that said Letters Patent is hereby corrected as shown below:

Claim 6, column 18, line 16 "greater" should read --less--

Signed and Sealed this

Fourth Day of November, 2008

JON W. DUDAS
*Director of the United States Patent and Trademark Office*